(12) United States Patent
Chung et al.

(10) Patent No.: US 11,189,671 B2
(45) Date of Patent: Nov. 30, 2021

(54) DISPLAY DEVICE

(71) Applicant: Samsung Display Co., Ltd., Yongin-si (KR)

(72) Inventors: Yungbin Chung, Yongin-si (KR); Sangwook Lee, Yongin-si (KR); Myunghan Lee, Seoul (KR); Hwa-su Lim, Yongin-si (KR); Seongkweon Heo, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/124,067

(22) Filed: Sep. 6, 2018

(65) Prior Publication Data
US 2019/0148467 A1   May 16, 2019

(30) Foreign Application Priority Data

Nov. 16, 2017   (KR) .................. 10-2017-0153372

(51) Int. Cl.
*H01L 51/52*   (2006.01)
*H01L 27/32*   (2006.01)
(Continued)

(52) U.S. Cl.
CPC .......... *H01L 27/3244* (2013.01); *G02B 5/208* (2013.01); *G02B 5/283* (2013.01);
(Continued)

(58) Field of Classification Search
CPC .................................................. H01L 27/3244
See application file for complete search history.

(56) References Cited

U.S. PATENT DOCUMENTS 6,888,305 B2   5/2005   Weaver
7,875,895 B2 *   1/2011   Kwack ............... H01L 51/5265
257/98
(Continued)

FOREIGN PATENT DOCUMENTS

CN   1582504 A   2/2005
CN   101315888 A   12/2008
(Continued)

OTHER PUBLICATIONS

Extended European Search Report for corresponding European Application No. 18206604.3, dated May 9, 2019, 10 pages.
(Continued)

*Primary Examiner* — Abul Kalam
(74) *Attorney, Agent, or Firm* — Lewis Roca Rothgerber Christie LLP

(57) ABSTRACT

A display device may include at least one optical control unit including first refractive index layers, second refractive index layers, and an optical compensation layer. The second refractive index layers may be stacked in an alternating manner with the first refractive index layers and may have a refractive index different from that of the first refractive index layers. The optical compensation layer may be disposed at least on the uppermost refractive index layer of the first and second refractive index layers to be in contact with the uppermost refractive index layer or below the lowermost refractive index layer of the first and second refractive index layers to be in contact with the lowermost refractive index layer. The optical compensation layer may have a thickness less than those of the first and second refractive index layers.

20 Claims, 24 Drawing Sheets

(51) Int. Cl.
G06F 3/041 (2006.01)
G02B 5/28 (2006.01)
G02B 5/20 (2006.01)

(52) U.S. Cl.
CPC ............ *G06F 3/041* (2013.01); *H01L 51/524* (2013.01); *H01L 51/5253* (2013.01); *H01L 51/5262* (2013.01); *H01L 51/5275* (2013.01); *H01L 51/5281* (2013.01)

(56) References Cited

U.S. PATENT DOCUMENTS

| | | | |
|---|---|---|---|
| 8,154,197 B2 | 4/2012 | Jun et al. | |
| 8,330,740 B2 | 12/2012 | Kang et al. | |
| 9,360,976 B2 | 6/2016 | Choi et al. | |
| 9,470,941 B2 | 10/2016 | Park et al. | |
| 9,698,203 B2 | 7/2017 | Cho et al. | |
| 10,069,102 B2 * | 9/2018 | Lee | H01L 51/5237 |
| 10,126,587 B2 | 11/2018 | Chung | |
| 10,256,438 B2 | 4/2019 | Kim et al. | |
| 10,483,484 B2 * | 11/2019 | Lee | H01L 51/5256 |
| 10,725,225 B2 * | 7/2020 | An | G02F 1/133512 |
| 10,746,995 B2 * | 8/2020 | Lee | G02B 1/116 |
| 2003/0085652 A1 | 5/2003 | Weaver | |
| 2004/0207920 A1 * | 10/2004 | Kitagawa | G02B 5/285 359/582 |
| 2008/0296600 A1 | 12/2008 | Kwack et al. | |
| 2008/0296660 A1 | 12/2008 | Park et al. | |
| 2011/0121271 A1 | 5/2011 | Jeon et al. | |
| 2013/0335799 A1 * | 12/2013 | Yoon | G02F 1/133553 359/227 |
| 2015/0009427 A1 | 1/2015 | Chen et al. | |
| 2015/0076457 A1 * | 3/2015 | Kwon | H01L 51/524 257/40 |
| 2016/0197308 A1 | 7/2016 | Jeong | |
| 2018/0040847 A1 * | 2/2018 | Lee | H01L 51/5275 |
| 2018/0074326 A1 * | 3/2018 | Lee | H01L 51/5203 |

FOREIGN PATENT DOCUMENTS

| | | |
|---|---|---|
| CN | 101599536 A | 12/2009 |
| CN | 102074568 A | 5/2011 |
| CN | 105762299 A | 7/2016 |
| CN | 106547136 A | 3/2017 |
| EP | 3 144 723 A1 | 3/2017 |
| KR | 10-2008-0105308 A | 12/2008 |
| KR | 10-1022155 B1 | 3/2011 |
| KR | 10-2014-0079074 A | 6/2014 |
| KR | 10-2015-0054193 A | 5/2015 |
| KR | 10-2015-0124075 A | 11/2015 |
| KR | 10-2017-0050850 A | 5/2017 |
| TW | 201411833 A | 3/2014 |
| WO | 2014/041743 A1 | 3/2014 |

OTHER PUBLICATIONS

Langereis, E., et al.; Plasma-assisted atomic layer deposition of $Al_2O_3$ moisture permeation barriers on polymers, Applied Physics Letters, AIP Publishing LLC, XP0120886600, vol. 89, No. 8, dated Aug. 25, 2006, 3 pages.

Seo, Seung-Woo, et al.; Moisture Permeation through Ultrathin $TiO_2$ Films Grown by Atomic Layer Deposition, Applied Physics Express, XP055582088, Jan. 1, 2012, 4 pages.

\* cited by examiner

DISPLAY DEVICE

CROSS-REFERENCE TO RELATED APPLICATION

This patent application claims priority to and the benefit of Korean Patent Application No. 10-2017-0153372, filed on Nov. 16, 2017, in the Korean Intellectual Property Office, the entire contents of which are hereby incorporated by reference.

BACKGROUND

Aspects of some example embodiments of the present disclosure relate to a display device.

Electronic devices, such as smart phones, tablets, notebook computers, navigation systems, and smart television sets, are being developed. The electronic device includes a display device that is used to provide information to a user. The electronic device further includes various electronic modules, in addition to the display device.

The electronic devices should be manufactured to meet the durability requirements suitable for their intended use. In particular, for display devices used in vehicles as compared to other display devices, the durability requirements are required more stringently (e.g., even under an extremely hot weather condition).

The above information discussed in this Background section is only for enhancement of understanding of the background of the described technology and therefore it may contain information that does not constitute prior art.

SUMMARY

Some example embodiments of the present disclosure include a highly-durable display device.

According to some example embodiments of the present disclosure, a display device may include a base layer, a circuit layer on the base layer, a display element layer on the circuit layer, and a optical control unit on the display element layer. The optical control unit may include first refractive index layers, second refractive index layers, and an optical compensation layer. The second refractive index layers may be stacked in an alternating manner with the first refractive index layers and may have a refractive index different from that of the first refractive index layers. The optical compensation layer may be at least disposed on the uppermost refractive index layer of the first and second refractive index layers to be in contact with the uppermost refractive index layer or below the lowermost refractive index layer of the first and second refractive index layers to be in contact with the lowermost refractive index layer. The optical compensation layer may have a thickness less than a thickness of each of the first and second refractive index layers.

In some embodiments, each of the first refractive index layers may satisfy the following equation 1, and each of the second refractive index layers may satisfy the following equation 2, $$2Ta = \left(m + \frac{1}{2}\right) \times \frac{\lambda}{n1} \quad \text{Equation 1}$$

$$2Tb = \left(m + \frac{1}{2}\right) \times \frac{\lambda}{n2} \quad \text{Equation 2}$$

where λ denotes a wavelength of light and ranges from 390 nm to 420 nm, m is 0 and a natural number, Ta is a thickness of each of the first refractive index layers, Tb is a thickness of each of the second refractive index layers, n1 is a refractive index of each of the first refractive index layers at the wavelength λ, and n2 is a refractive index of each of the second refractive index layers at the wavelength λ.

In some embodiments, the refractive index n1 ranges from 1.4 to 1.6, and the refractive index n2 ranges from 1.9 to 2.1.

In some embodiments, the first refractive index layers may include one of silicon oxynitride, silicon nitride, and silicon oxide, and the second refractive index layers may include another one of silicon oxynitride, silicon nitride, and silicon oxide.

In some embodiments, the optical compensation layer may include one of silicon oxynitride, silicon nitride, and silicon oxide, and the optical compensation layer disposed below the lowermost refractive index layer may include a material different from the lowermost refractive index layer.

In some embodiments, the optical compensation layer may include a lower optical compensation layer disposed below the lowermost refractive index layer and an upper optical compensation layer disposed on the uppermost refractive index layer. The lower optical compensation layer may include a material that is different from the lowermost refractive index layer and is the same as a refractive index layer directly disposed on the lowermost refractive index layer.

In some embodiments, the upper optical compensation layer may include a material that is different from the uppermost refractive index layer and is the same as a refractive index layer directly disposed below the uppermost refractive index layer. A thickness of the lower optical compensation layer may be 45% to 55% of a thickness of a refractive index layer directly disposed on the lowermost refractive index layer.

In some embodiments, a refractive index of the lower optical compensation layer may be substantially equal to a refractive index of a refractive index layer directly disposed on the lowermost refractive index layer.

In some embodiments, the display element layer may include a first organic light emitting diode to generate a first light having a peak within a first central wavelength range, a second organic light emitting diode to generate a second light having a peak within a wavelength range that is longer than the first central wavelength range, and a third organic light emitting diode to generate a third light having a peak within a wavelength range that is longer than that of the second light.

In some embodiments, the optical compensation layer may be configured to allow light, whose wavelength ranges from 390 nm to 420 nm, to pass therethrough with a transmission ratio of about 30% or lower, and the first central wavelength range ranges from 440 nm to 460 nm.

In some embodiments, a deviation in transmittance of the first light, the second light, and the third light passing through the optical compensation layer may be less than 7%.

In some embodiments, the optical control unit may be directly disposed on the display element layer.

In some embodiments, the display device may further include a thin-film encapsulation layer directly disposed on the display element layer. The optical control unit may be disposed on the thin-film encapsulation layer.

In some embodiments, the display device may further include a sensing to sense an external input. The optical control unit may be in contact with the sensing electrode.

In some embodiments, the first refractive index layers may include 5 to 15 silicon nitride layers, and the second refractive index layers may include 5 to 15 silicon oxide layers.

According to some embodiments of the inventive concept, a display device may include a base layer, first to third driving transistors on the base layer, first to third light-emitting diodes, which are respectively connected to the first to third transistors and are used to generate first to third lights, respectively, whose wavelengths are different from each other, and a optical control unit on the first to third light-emitting diodes. The optical control unit may include first refractive index layers, second refractive index layers, and an optical compensation layer. The second refractive index layers may be stacked in an alternating manner with the first refractive index layers and may have a refractive index different from that of the first refractive index layers. The optical compensation layer may be at least disposed on the uppermost refractive index layer of the first and second refractive index layers to be in contact with the uppermost refractive index layer or below the lowermost refractive index layer of the first and second refractive index layers to be in contact with the lowermost refractive index layer. The optical compensation layer may have a thickness less than those of the first and second refractive index layers.

In some embodiments, the optical control unit may be configured to allow light, whose wavelength ranges from 390 nm to 420 nm, to pass therethrough with a transmission ratio of about 30% or lower, and to allow the first to third lights to pass therethrough with a transmission ratio of about 80% or higher.

In some embodiments, a peak of the first light may be positioned at a wavelength that is longer than a wavelength of 390 nm to 420 nm, the second light may have a wavelength longer than that of the first light, and the third light may have a wavelength longer than that of the second light.

In some embodiments, a deviation in transmittance of the first to third lights passing through the optical compensation layer may be less than 7%.

In some embodiments, the first refractive index layers may include one of silicon nitride and silicon oxide, and the second refractive index layers may include the other of silicon nitride and silicon oxide.

BRIEF DESCRIPTION OF THE DRAWINGS

Aspects of some example embodiments will be more clearly understood from the following brief description taken in conjunction with the accompanying drawings. The accompanying drawings represent non-limiting, example embodiments as described herein.

Figure 1:
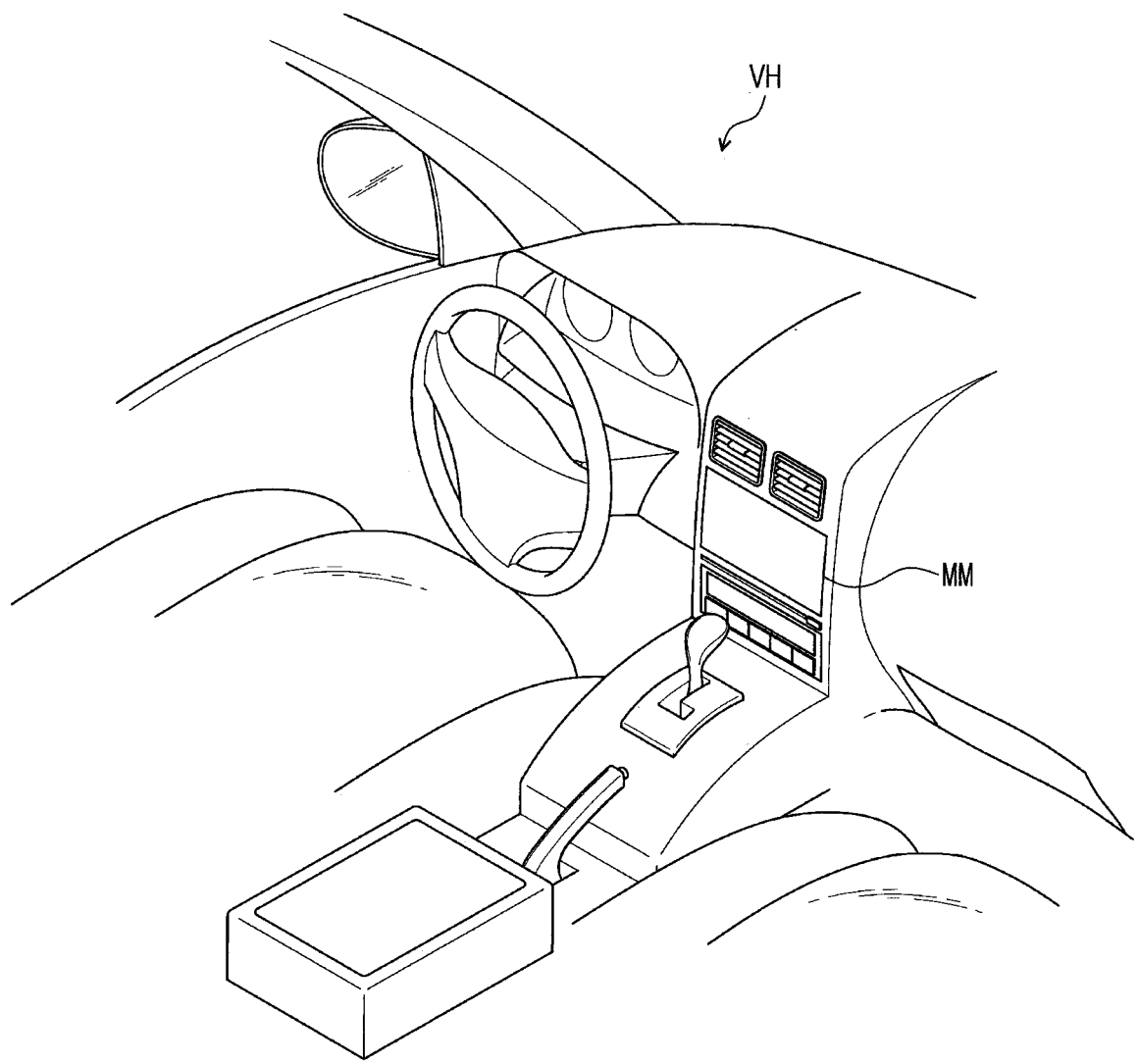
FIG. 1 is a diagram illustrating the interior of a vehicle, in which an electronic device is included according to some example embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Aspects of some example embodiments of the present disclosure relate to a display device, for example, a display device with a multi-layered optical structure.

Aspects of some example embodiments of the present disclosure will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
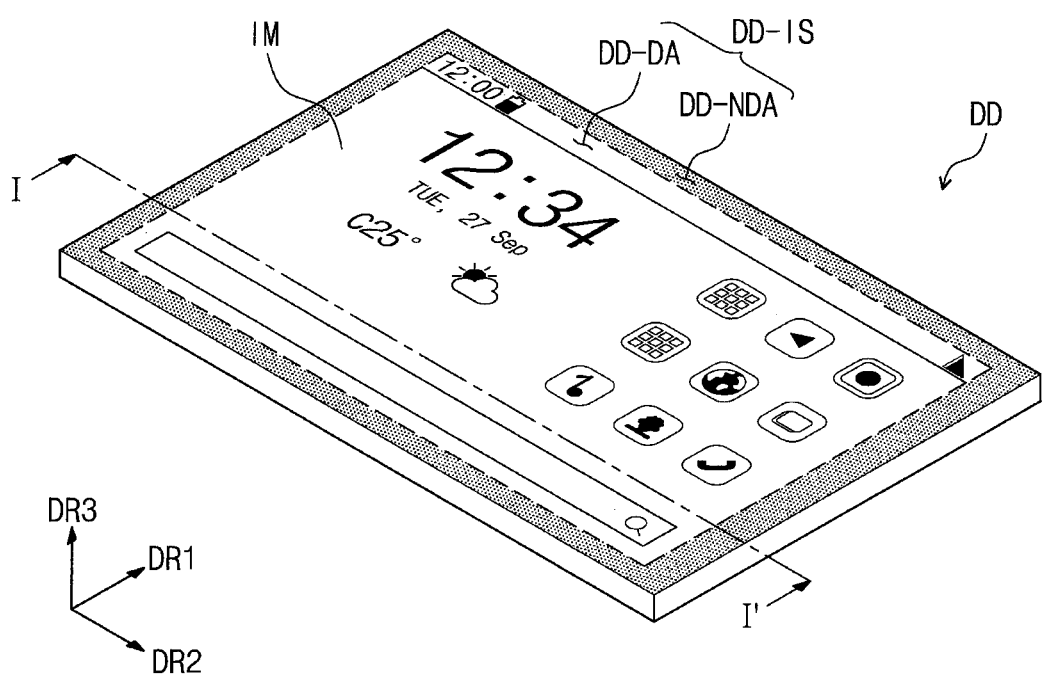
FIG. 2 is a perspective view illustrating a display device according to some example embodiments.

FIG. 1 is a diagram illustrating the interior of a vehicle VH, in which an electronic device MM is included according to some example embodiments. FIG. 2 is a perspective view illustrating a display device DD according to some example embodiments.

As shown in FIG. 1, the electronic device MM according to some example embodiments may be a multimedia device placed at a center fascia of a vehicle. The multimedia device may include a display device DD shown in FIG. 2. Although not shown, the multimedia device may further include a mainboard and electronic modules, a camera module, and a power module, which are mounted on the mainboard.

According to some example embodiments, an example of the display device DD, which can be used as the multimedia device at the center fascia is illustrated, but embodiments of the present disclosure are not limited thereto. The display device DD may be used for large-sized electronic devices (e.g., television sets and monitors) or various electronic devices (e.g., tablets, game machines, and smart watches).

As shown in FIG. 2, the display device DD may include a display surface DD-IS, which is used to display an image IM. The display surface DD-IS may be defined to be parallel to a first direction axis DR1 and a second direction axis DR2. A direction normal to the display surface DD-IS (i.e., a thickness direction of the display device DD) will be referred to as a third direction axis DR3.

If a display direction of an image is set to the third direction axis DR3, the third direction axis DR3 may be used to differentiate a front or top surface of each element or unit from a rear or bottom surface. Hereinafter, first to third directions may be directions indicated by the first to third direction axes DR1, DR2, and DR3, respectively, and will be identified with the same reference numbers.

In FIG. 2, the display device DD is illustrated to have a flat display surface, but the inventive concept is not limited thereto. The display surface of the display device DD may have a curved or three-dimensional shape. In the case where the display device DD has the three-dimensional display surface, the display surface may include a plurality of display regions that are oriented in different directions. For example, the display surface of the display device DD may be shaped like a polygonal pillar.

According to some example embodiments, the display device DD may be a rigid display device. However, embodiments of the present invention are not limited thereto, and in certain embodiments, the display device DD may be a flexible display device.

As shown in FIG. 2, the display surface DD-IS may include a display region DD-DA, which is used to display the image IM, and a non-display region DD-NDA, which is provided adjacent to the display region DD-DA. The non-display region DD-NDA may not be used to display an image. As an example of the image IM, icon images are shown in FIG. 1. In some embodiments, the non-display region DD-NDA may be used as a bezel of an electronic device.

As shown in FIG. 2, the display region DD-DA may have a tetragonal or rectangular shape. The non-display region DD-NDA may be provided to enclose the display region DD-DA. However, the inventive concept is not limited to this example, and in certain embodiments, shapes of the display and non-display regions DD-DA and DD-NDA may be variously changed in a complementary manner. For example, the non-display region DD-NDA may be locally provided in two edge regions of the display surface DD-IS, which are opposite to each other in the first direction DR1.

FIGS. 3A to 3H are sectional views illustrating display devices DD according to some embodiments of the inventive concept. FIGS. 3A to 3H illustrate vertical sections, each of which is taken on a plane defined by the second and third direction axes DR2 and DR3. In FIGS. 3A to 3H, the display devices DD are illustrated in a simplified manner in order to describe a stacking structure of a functional panel and/or functional units therein.

In some embodiments, the display device DD may include a display panel, an input sensing unit (or input sensor, or input sensing circuit), an anti-reflection unit (or anti-reflection component), a optical control unit (or light control component), and a window unit (or window component). At least two of the display panel, the input sensing unit, the anti-reflection unit, the optical control unit, and the window unit may be successively formed by a successive process or may be bonded to each other by an adhesive member. FIGS. 3A to 3H illustrate examples in which a pressure sensitive adhesive film PSA is used as the adhesive member. In various embodiments to be described below, the adhesive member may be a typical adhesive material or a gluing agent, but the inventive concept is not limited thereto. In some embodiments, the anti-reflection unit and the optical control unit may be replaced with other unit or may be omitted. In certain embodiments, the input sensing unit may be omitted.

In FIGS. 3A to 3H, if a unit (e.g., the input-sensing unit, the anti-reflection unit, the optical control unit, or the window unit) is formed on another element by a successive process, the unit will be expressed using a term "layer". By contrast, if a unit (e.g., the input sensing unit, the anti-reflection unit, the optical control unit, or the window unit) is bonded to another element by an adhesive member, the unit will be expressed using the term "panel".

The unit expressed using the term "panel" may include a base layer (e.g., a synthetic resin film, a composite film, or a glass substrate) providing a base surface, but the unit expressed using the term "layer" may not have the base layer. In other words, the unit expressed using the term "layer" may be placed on a base surface that is provided by another element or unit. The input sensing unit, the anti-reflection unit, the optical control unit, and the window unit may be referred to as an input-sensing panel ISP, an anti-reflection panel RPP, a light control panel LCP, and a window panel WP or to as an input sensing layer ISL, an anti-reflection layer RPL, a light control layer LCL, and a window layer WL, according to the presence or absence of the base layer.

Figure 3A:
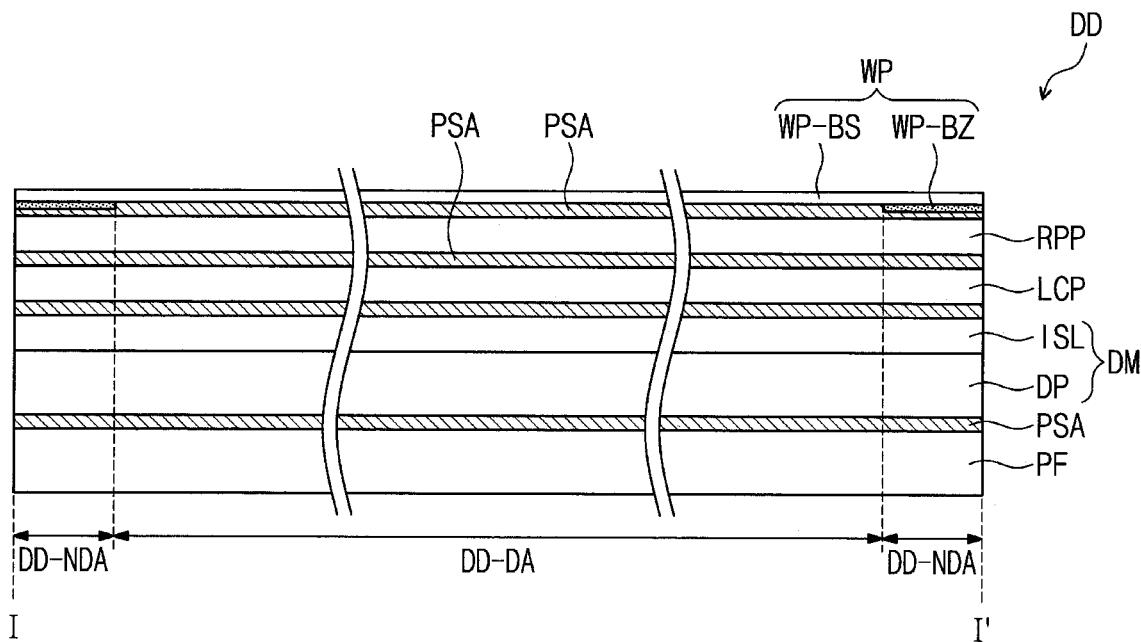
FIGS. 3A to 3H are sectional views of display devices according to some example embodiments.

As shown in FIG. 3A, the display device DD may include a display panel DP, the input sensing layer ISL, the light control panel LCP, the anti-reflection panel RPP, the window panel WP, and a protection member PF. The input sensing layer ISL may be directly provided on the display panel DP. In the specification, the expression "an element B1 may be directly provided on an element A1" may mean that an adhesive member is not provided between the elements A1 and B1. After the formation of the element A1, the element B1 may be formed on a base surface, which is provided by the element A1, through a successive process.

The display panel DP and the input-sensing layer ISL, which is directly provided on the display panel DP, may be referred to as a display module DM. The pressure sensitive adhesive films PSA may be respectively provided between the display module DM and the light control panel LCP, between the light control panel LCP and the anti-reflection panel RPP, and between the anti-reflection panel RPP and the window panel WP.

The display panel DP may be configured to generate an image to be displayed to the outside, and the input-sensing layer ISL may be configured to obtain coordinate information regarding an external input (e.g., a touch event). The protection member PF may be configured to support the display panel DP and to protect the display panel DP from an external impact.

The protection member PF may include a plastic film serving as a base layer. The protection member PF may include a plastic film containing one selected from the group consisting of thermoplastic resins (e.g., polyethylene terephthalate (PET), polyethylene (PE), polyvinylchloride (PVC), polypropylene (PP), polystyrene (PS), polyacrylonitrile (PAN), styrene-acrylonitrile copolymer (SAN), acrylonitrile-butadiene-styrene (ABS), polymethyl methacrylate (PMMA), and combinations thereof). In the case where the protection member PF is formed of polyethylene terephthalate (PET), it may be excellent in heat-resistant, fatigue strength, and electric characteristics and may be insensitive to temperature and humidity.

Materials for the protection member PF are not limited to plastic resins, and organic/inorganic composites may be used for the protection member PF. The protection member PF may include a porous organic layer and an inorganic material, which is formed to fill pores of the organic layer.

According to some example embodiments, the display panel DP may be a light-emitting type display panel, but embodiments of the present disclosure are not limited to a specific type of the display panel DP, and may include various other types of display panels. For example, the display panel DP may be an organic light emitting display panel or a quantum dot light-emitting display panel. A light emitting layer of the organic light emitting display panel may be formed of or include an organic luminescent material. The light emitting layer of the quantum dot light-emitting display panel may include quantum dots and/or quantum rods. For the sake of simplicity, the description that follows will refer to an example in which the display panel DP is the organic light emitting display panel.

The light control panel LCP may be configured to block a natural or solar light, which is incident into the display panel DP from an outer space, in a specific wavelength range. In addition, the light control panel LCP may be configured to allow light (hereinafter, an image light) generated in the display panel DP to be emitted toward the outer space with a uniform brightness regardless of a wavelength range. Here, the term "outer space" may refer to a space where a user is located (i.e., outside the display device).

The light control panel LCP may include a plurality of layers. For example, the light control panel LCP may include a first group and a second group, each of which includes at least one layer, and which are different from each other in terms of their refractive index. In addition, the light control panel LCP may further include at least one layer, which is thinner than the layer constituting the first or second group and constitutes a third group. The light control panel LCP will be described in more detail below.

The anti-reflection panel RPP may be configured to reduce reflectance of a natural or solar light that is incident from an outer space to the window panel WP. In some embodiments, the anti-reflection panel RPP may include a phase retarder and a polarizer. The phase retarder may be of a film type or a liquid crystal coating type and may include a $\lambda/2$ and/or $\lambda/4$ phase retarder. The polarizer may also be of a film type or a liquid crystal coating type. The polarizer of the film type may include an elongated synthetic resin film, whereas the polarizer of the liquid crystal coating type may include liquid crystals arranged with a specific orientation. The phase retarder and the polarizer may further include a protection film. At least one of the phase retarder, the polarizer, or the protection films thereof may be used as a base layer of the anti-reflection panel RPP.

In some embodiments, the anti-reflection panel RPP may include color filters. The color filters may be arranged in a specific manner. The arrangement of the color filters may be determined in consideration of colors of lights to be emitted from pixels in the display panel DP. The anti-reflection panel RPP may further include a black matrix provided adjacent to the color filters.

In some embodiments, the window panel WP may include a base layer WP-BS and a light-blocking pattern WP-BZ. The base layer WP-BS may include a glass substrate and/or a synthetic resin film. The base layer WP-BS may not be limited to a single-layered structure. The base layer WP-BS may include two or more films that are bonded to each other by an adhesive member.

The light-blocking pattern WP-BZ may be partially overlapped with the base layer WP-BS. The light-blocking pattern WP-BZ may be provided on the rear surface of the base layer WP-BS to define a bezel region of the display device DD (i.e., the non-display region DD-NDA of FIG. 1).

The light-blocking pattern WP-BZ may be a colored organic layer and may be formed by, for example, a coating method. Although not shown, the window panel WP may further include a functional coating layer provided on the front surface of the base layer WP-BS. The functional coating layer may include an anti-fingerprint layer, an anti-reflection layer, a hard coating layer, and so forth.

In FIGS. 3B to 3H, the window panel WP and the window layer WL are illustrated in a simplified manner (e.g., without distinction of the base layer WP-BS and the light-blocking pattern WP-BZ).

Figure 3B:
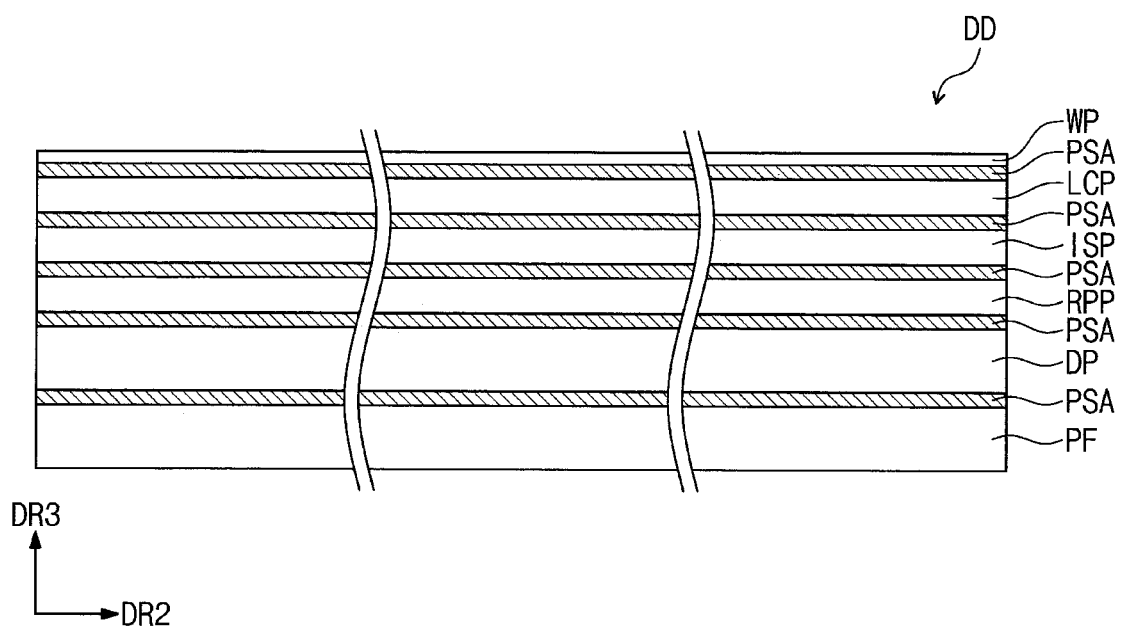
Figure 3C:
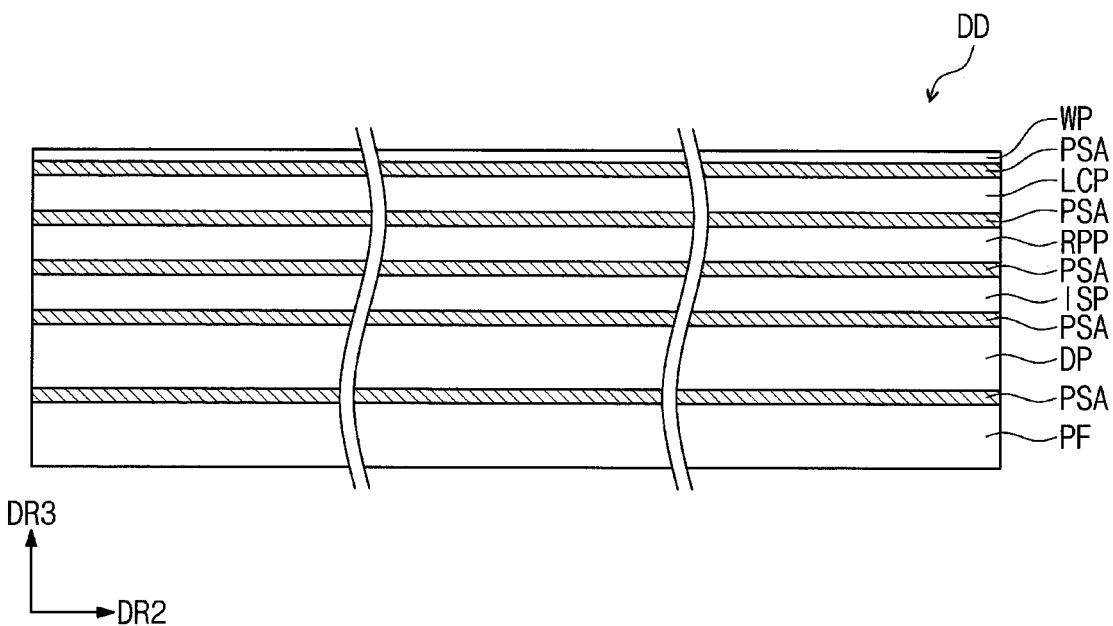

As shown in FIGS. 3B and 3C, the display device DD may include the protection member PF, the display panel DP, the input-sensing panel ISP, the light control panel LCP, the anti-reflection panel RPP, and the window panel WP. A stacking order of the input-sensing panel ISP and the anti-reflection panel RPP may be changed. Although not shown, a stacking order of the light control panel LCP may be changed. For example, positions of the input-sensing panel ISP, the anti-reflection panel RPP, and the light control panel LCP may be changed.

Figure 3D:
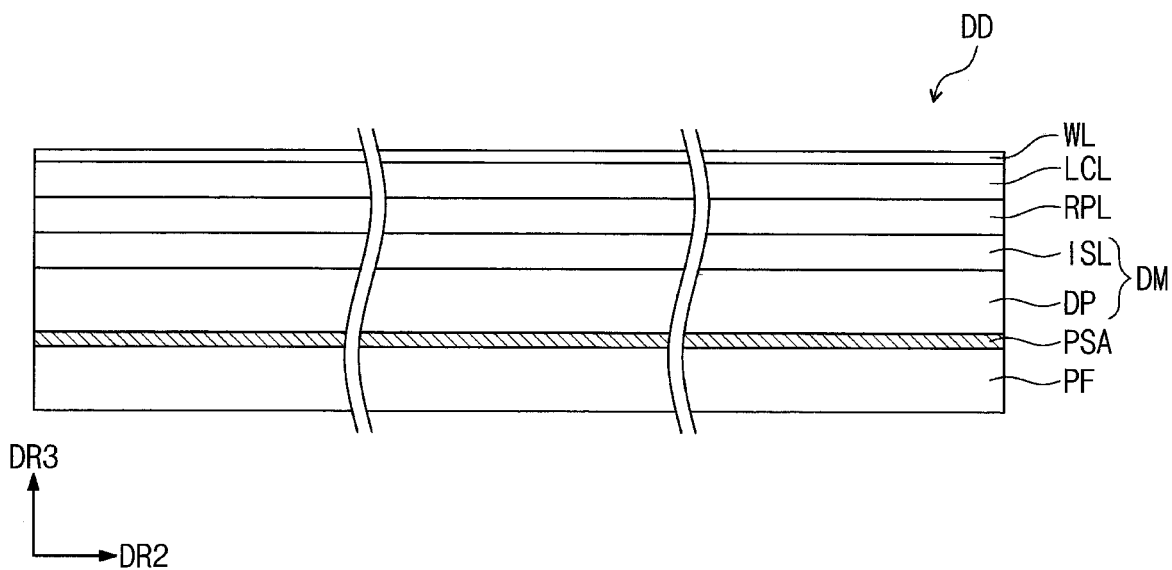

As shown in FIG. 3D, the display device DD may include the protection member PF, the display panel DP, the input sensing layer ISL, the anti-reflection layer RPL, the light control layer LCL, and the window layer WL. Adhesive members may be omitted from the display device DD, and in this case, the input sensing layer ISL, the anti-reflection layer RPL, the light control layer LCL, and the window layer WL may be successively formed on a base surface, which is provided by the display panel DP. The stacking order of the input sensing layer ISL, the anti-reflection layer RPL, and the light control layer LCL may be changed.

Here, the anti-reflection layer RPL may include a liquid crystal coating type phase retarder and a liquid crystal coating type polarizer. The phase retarder and the polarizer may include a discotic liquid crystal layer having liquid crystal molecules that are tilt a predetermined direction. The liquid crystal molecules has a tilt angle with respect to a layer that is disposed under the anti-reflection layer RPL.

Figure 3E:
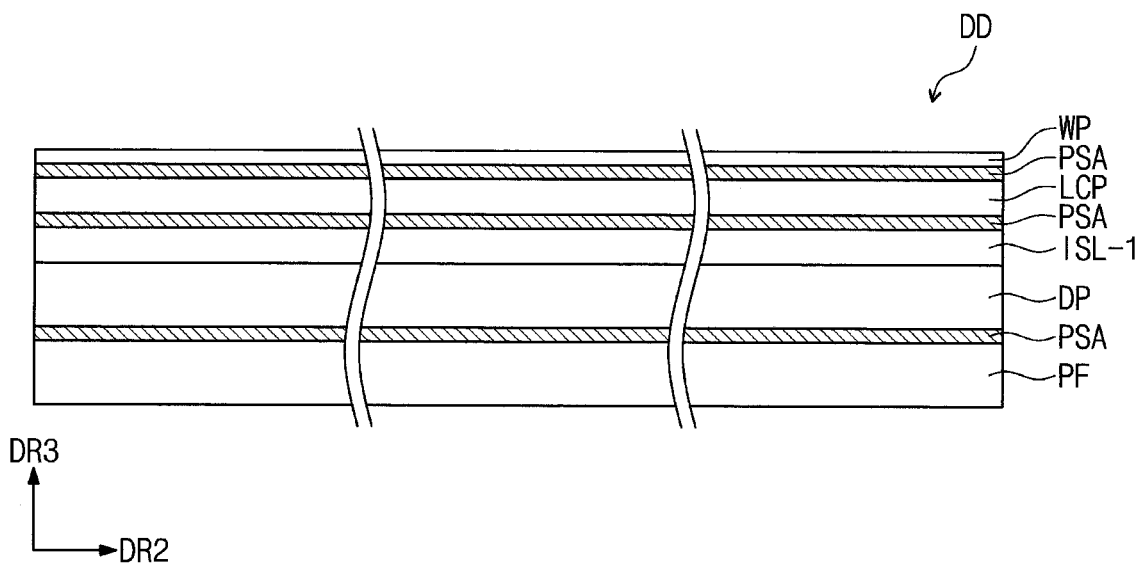
Figure 3F:
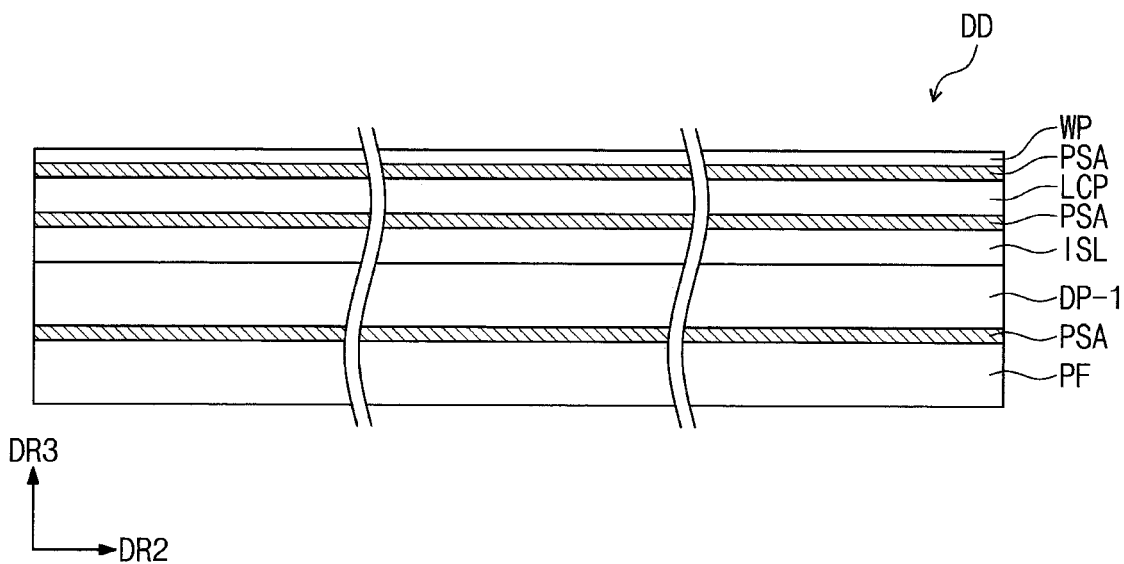

As shown in FIGS. 3E and 3F, the display device DD may not include an additional anti-reflection unit. Unlike the input-sensing panel ISP or the input sensing layer ISL shown in FIGS. 3A to 3D, an input sensing layer ISL-1 of FIG. 3E may further include a color filter having an anti-reflection function. Unlike the display panel DP shown in FIGS. 3A to 3D, a display panel DP-1 of FIG. 3F may further include a color filter having an anti-reflection function.

Figure 3G:
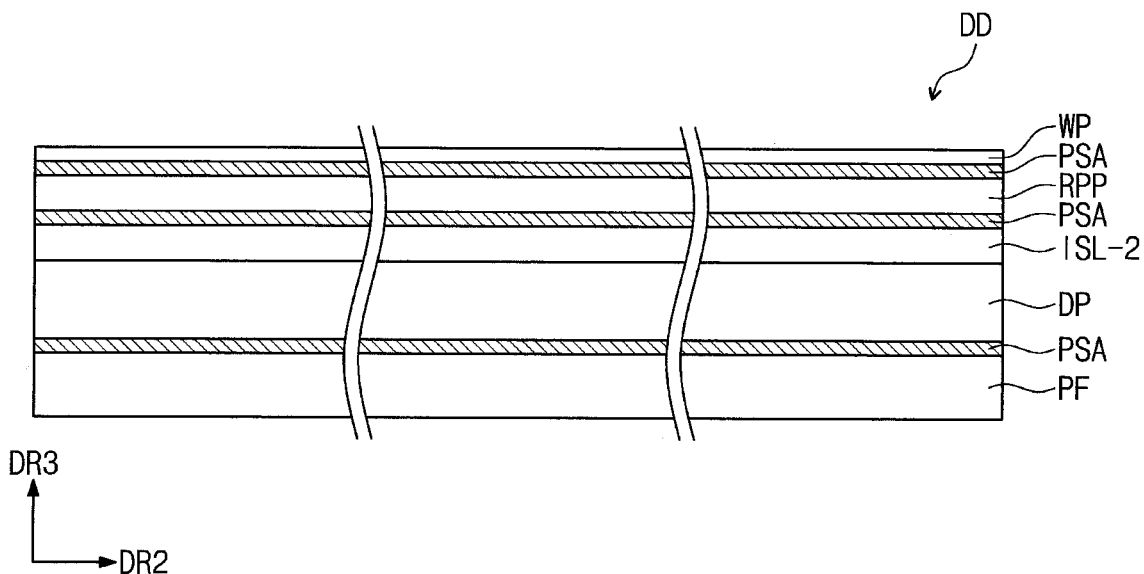
Figure 3H:
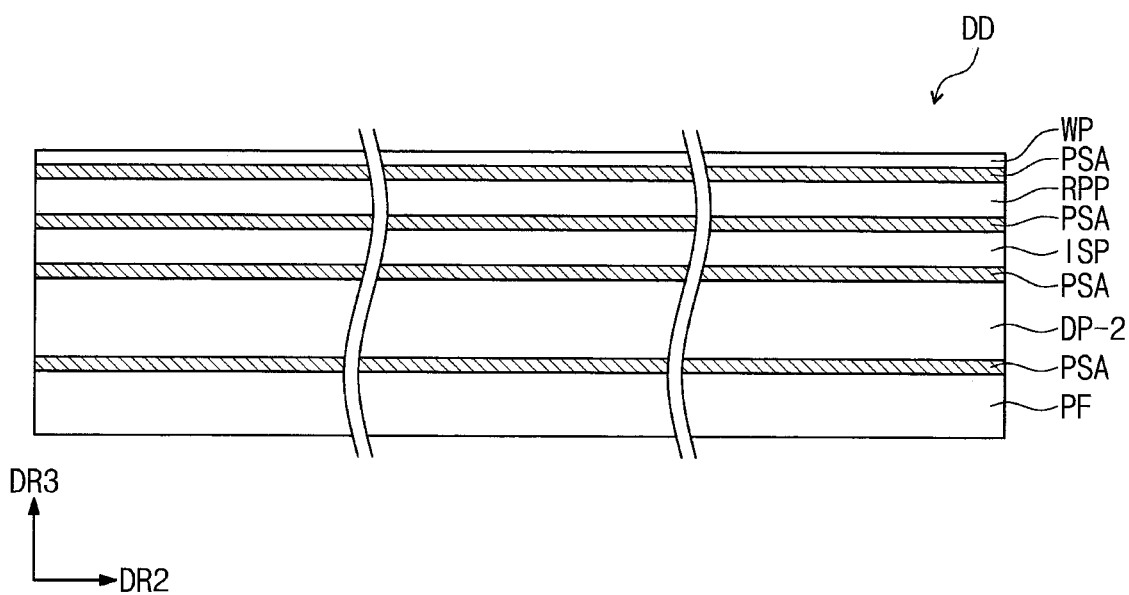

As shown in FIGS. 3G and 3H, the display device DD may not include an additional optical control unit. Unlike the input-sensing panel ISP or the input sensing layer ISL shown in FIGS. 3A to 3D, an input sensing layer ISL-2 of FIG. 3G may include the first to third groups of the layers, which have an optical control function to be described below. Unlike the display panel DP shown in FIGS. 3A to 3D, a display panel DP-2 of FIG. 3H may include the first to third groups of the layers, which have an optical control function to be described below.

Figure 4:
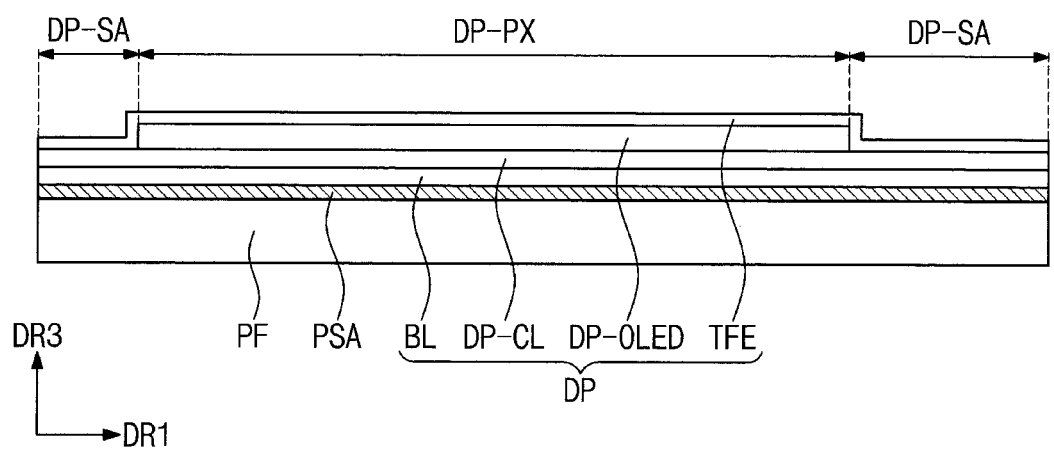
FIG. 4 is a sectional view illustrating a display panel according to some example embodiments.
Figure 5A:
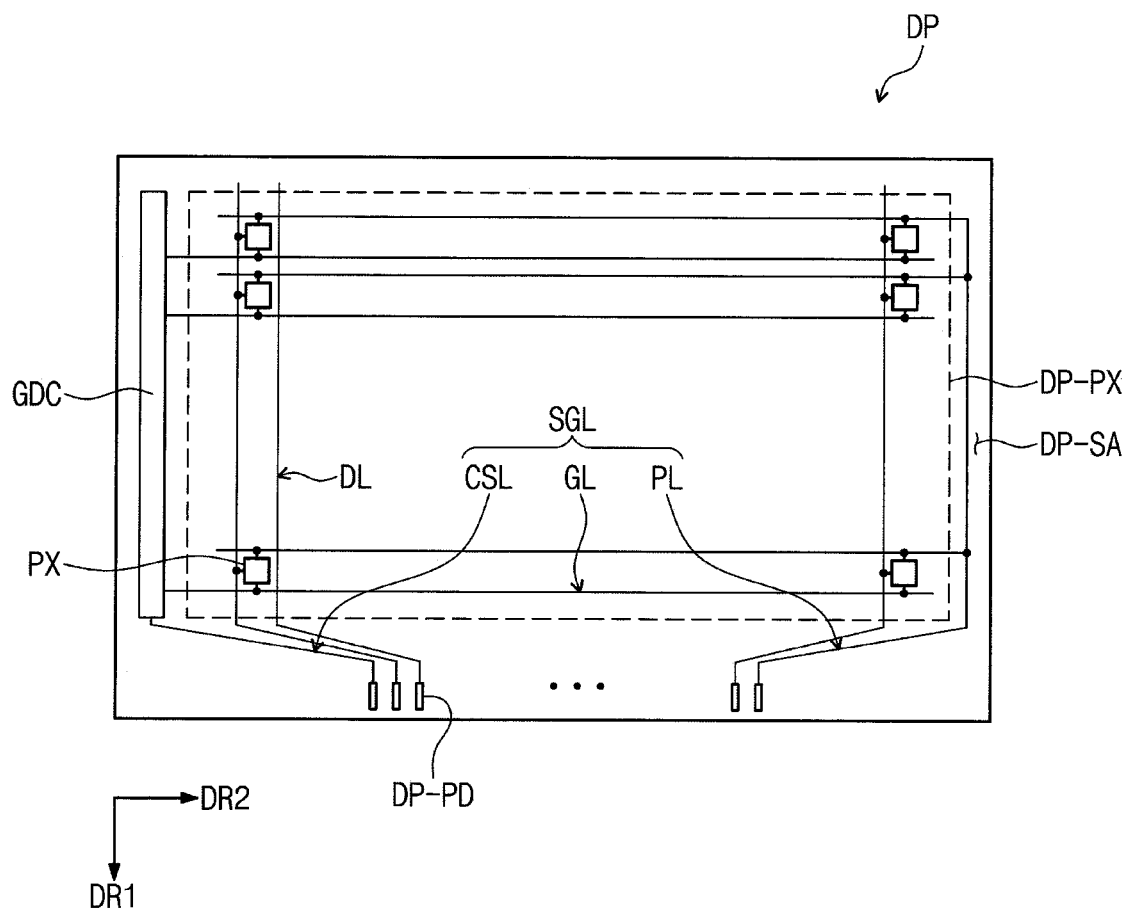
FIG. 5A is a plan view illustrating a display panel according to some example embodiments.
Figure 5B:
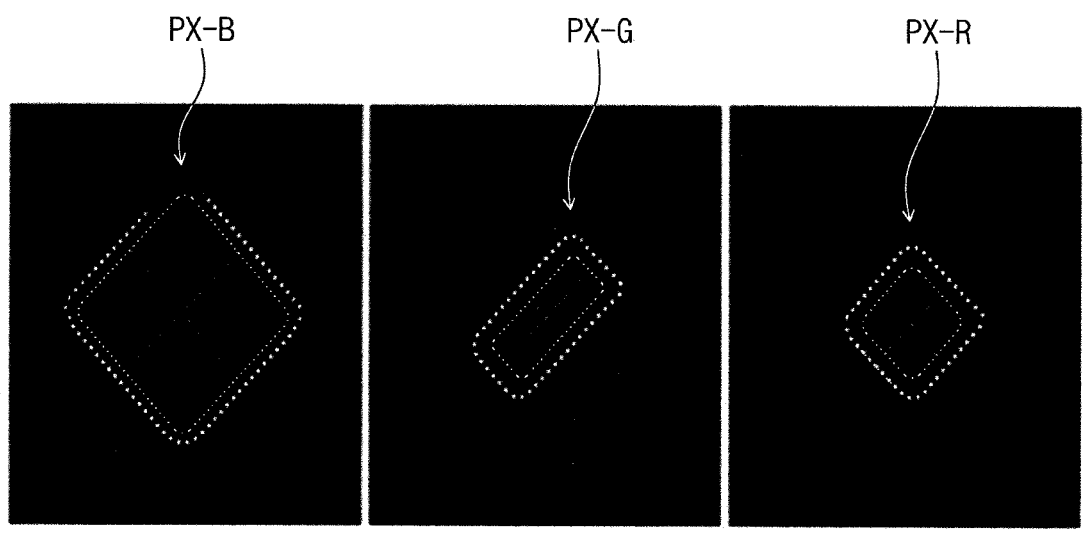
FIG. 5B is a plan view illustrating pixels according to some example embodiments.
Figure 6:
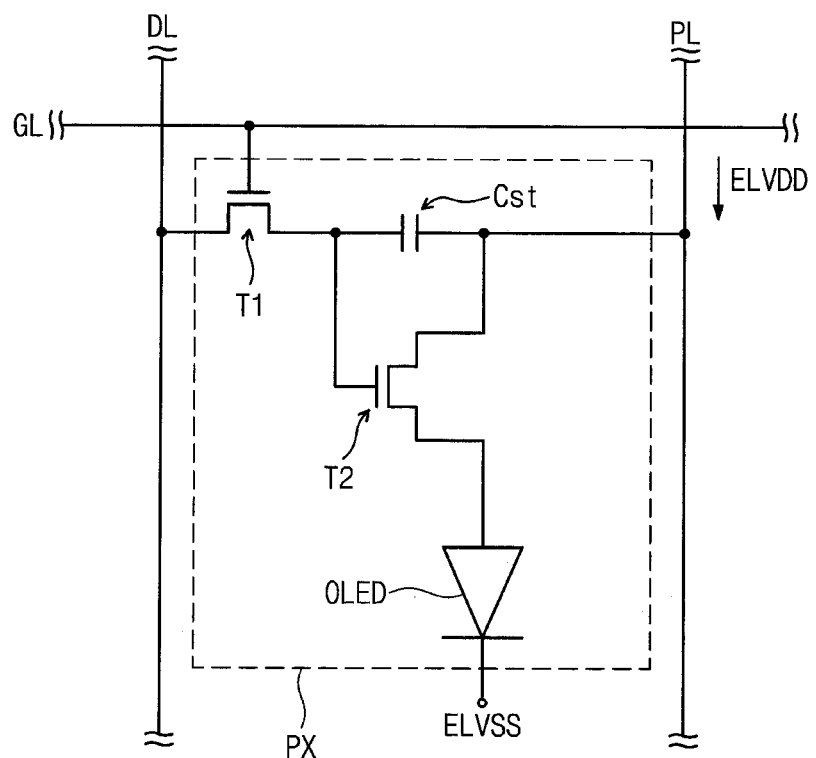
FIG. 6 is an equivalent circuit diagram illustrating a pixel according to some example embodiments.
Figure 7:
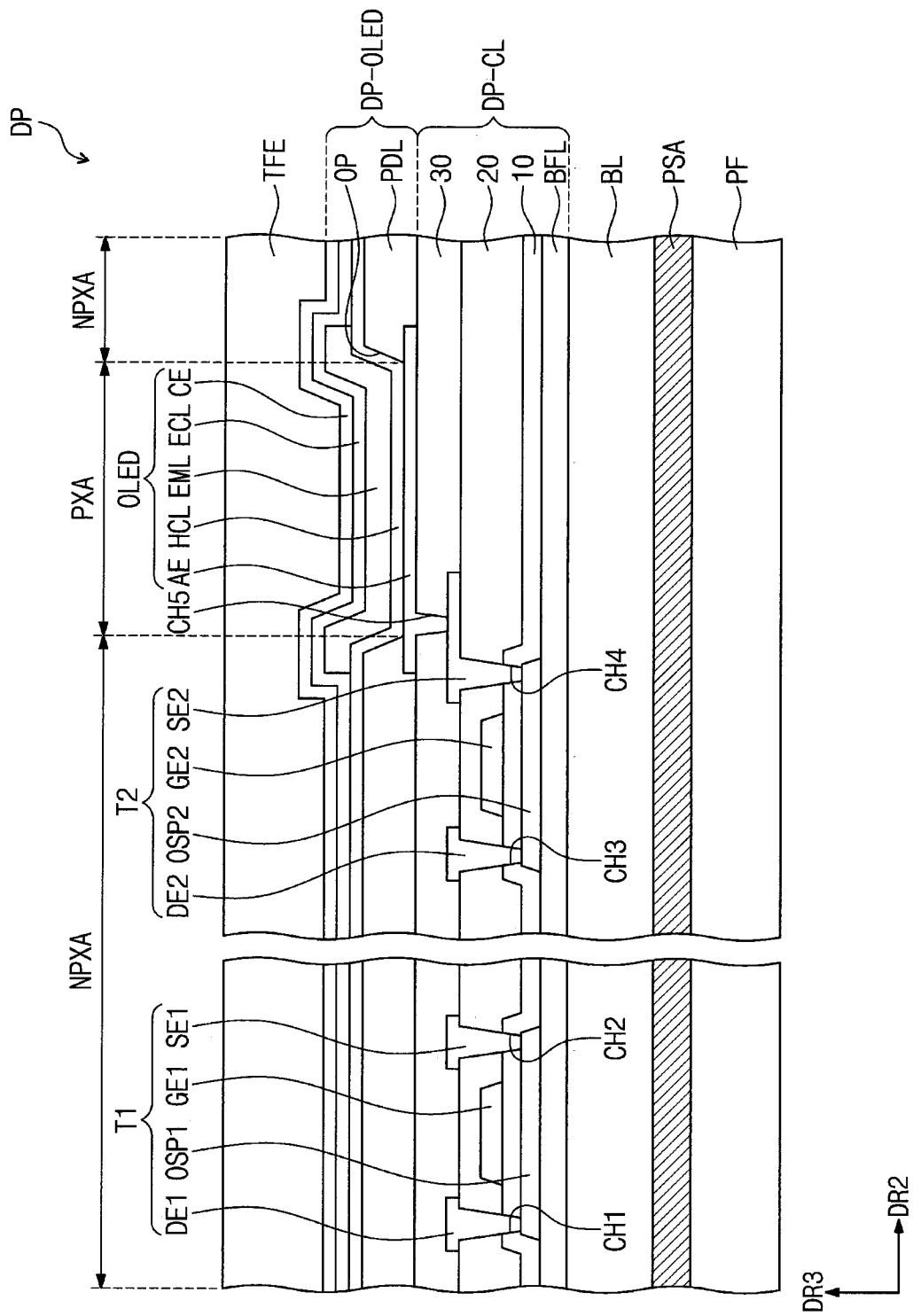
FIG. 7 is a sectional view illustrating a display panel according to some example embodiments.

FIG. 4 is a sectional view illustrating the display panel DP according to some example embodiments. FIG. 5A is a plan view illustrating the display panel DP according to some example embodiments. FIG. 5B is a plan view illustrating pixels PX-R, PX-G, and PX-B according to some example embodiments. FIG. 6 is an equivalent circuit diagram illustrating a pixel PX according to some example embodiments. FIG. 7 is an enlarged sectional view illustrating the display panel DP according to some example embodiments. The display panel DP to be described below can be applied to all of the display devices DD described with reference to FIGS. 3A to 3H. FIGS. 4 and 7 illustrate the protection member PF provided on the rear surface of the display panel DP.

As shown in FIG. 4, the display panel DP may include a base layer BL and a circuit device layer DP-CL, a display element layer DP-OLED, and a thin-film encapsulation layer TFE, which are provided on the base layer BL. Although not shown, the display panel DP may further include functional layers, such as a buffer layer and a refractive index controlling layer.

The base layer BL may be formed of or include a synthetic resin film. The synthetic resin layer may be formed on a working substrate, which is used to fabricate the display panel DP. Thereafter, a conductive layer, an insulating layer, and so forth may be formed on the synthetic resin layer. If the working substrate is removed, the synthetic resin layer may be used as the base layer BL. The synthetic resin layer may include a thermosetting resin. The synthetic resin layer may be a polyimide-based resin layer, and the inventive concept is not limited to a specific material to be used for the base layer BL. In addition, the base layer BL may include a glass substrate, a metal substrate, or an organic/inorganic composite substrate.

The circuit device layer DP-CL may include at least one insulating layer and at least one circuit device. Hereinafter, an insulating layer in the circuit device layer DP-CL will be referred to as an intermediate insulating layer. The intermediate insulating layer may include at least one intermediate inorganic layer and/or at least one intermediate organic layer. The circuit device may include signal lines, pixel driving circuits, and so forth. The formation of the circuit device layer DP-CL may include forming an insulating layer, a semiconductor layer, and a conductive layer using a coating or deposition process and patterning the insulating layer, the semiconductor layer, and the conductive layer using a photolithography and etching process.

The display element layer DP-OLED may include a light-emitting device. The display element layer DP-OLED may include a plurality of organic light emitting diodes. The display element layer DP-OLED may further include an organic layer, such as a pixel definition layer.

The thin-film encapsulation layer TFE may be provided to hermetically seal the display element layer DP-OLED. The thin-film encapsulation layer TFE may include at least one insulating layer. In some embodiments, the thin-film encapsulation layer TFE may include at least one inorganic layer (hereinafter, an inorganic encapsulation layer) and/or at least one organic layer (hereinafter, an organic encapsulation layer). In certain embodiments, the thin-film encapsulation layer TFE may include at least one organic layer and at least one inorganic encapsulation layer.

The inorganic encapsulation layer may be used to protect the display element layer DP-OLED from moisture or oxygen, and the organic encapsulation layer may be used to protect the display element layer DP-OLED from a contamination material such as dust particles. The inorganic encapsulation layer may include at least one of a silicon nitride layer, a silicon oxynitride layer, a silicon oxide layer, a titanium oxide layer, or an aluminum oxide layer, but the inventive concept is not limited thereto. The organic encapsulation layer may include an acrylic organic layer, but the inventive concept is not limited thereto.

FIG. 4 illustrates an example in which the thin-film encapsulation layer TFE is provided to fully cover the display panel DP, but the inventive concept is not limited thereto. As an example, the thin-film encapsulation layer TFE may be locally provided on only a pixel region DP-PX. As another example, the thin-film encapsulation layer TFE may be locally provided on the pixel region DP-PX and a portion of a peripheral region DP-SA. In certain embodiments, the thin-film encapsulation layer TFE may be omitted. A sealing substrate (e.g., a glass substrate) may be used to replace the thin-film encapsulation layer TFE. The sealing substrate may be coupled or bonded to the display panel DP by a sealant. A sealant provided on the peripheral region DP-SA may be used to directly couple the glass substrate to the circuit device layer DP-CL.

As shown in FIG. 5A, the display panel DP may include a driving circuit GDC, a plurality of signal lines SGL, a plurality of signal pads DP-PD, and a plurality of pixels PX. Each of the pixels PX may include an organic light emitting diode and a pixel driving circuit connected thereto. The driving circuit GDC, the signal lines SGL, the signal pads DP-PD, and the pixel driving circuit may be included as parts of the circuit device layer DP-CL shown in FIG. 4.

The pixels PX may be classified into a plurality of groups, according to colors of the pixels. For example, the pixels PX may include red pixels, green pixels, and blue pixels. In certain embodiments, the pixels PX may further include white pixels. Pixels in different groups may differ from each other in terms of materials for the organic light emitting layer or colors of the color filter.

As shown in FIG. 5B, the red pixel PX-R, the green pixel PX-G, and the blue pixel PX-B may differ from each other in terms light-emitting area and shape. The normal light-emitting areas of the red pixel PX-R, the green pixel PX-G, and the blue pixel PX-B are depicted by an outer dotted lines. As shown in FIG. 5B, the blue pixel PX-B has the largest area, and the green pixel PX-G has the smallest area. The blue pixel PX-B and the red pixel PX-R are shaped like a square, and the green pixel PX-G is shaped like a rectangle.

As shown in FIG. 5A, the driving circuit GDC may include a scan driving circuit. The scan driving circuit may be configured to generate a plurality of scan signals and sequentially output the scan signals to a plurality of scan lines GL to be described below. In addition, the scan driving circuit may be configured to output other control signals to a driving circuit of the pixel PX.

The scan driving circuit may include a plurality of thin-film transistors that are formed by the same process as that for the driving circuit of the pixel PX (e.g., by a low temperature polycrystalline silicon (LTPS) process or a low temperature polycrystalline oxide (LTPO) process).

The signal lines SGL may include scan lines GL, data lines DL, a power line PL, and a control signal line CSL. Each of the scan lines GL may be connected to corresponding ones of the pixels PX, and each of the data lines DL may be connected to corresponding ones of the pixels PX. The power line PL may be connected to the pixels PX. The control signal line CSL may be used to provide control signals to the scan driving circuit. The signal pads DP-PD may be connected to corresponding ones of the signal lines SGL.

Although not shown in FIG. 5A, a circuit board may be electrically connected to the display panel DP. The circuit board may be a rigid or flexible circuit board. A driving chip may be mounted on the circuit board.

Although not shown, in certain embodiments, the driving chip may be mounted on the display panel DP. The driving chip may be connected to the data lines DL and may be connected to the signal pads DP-PD. Accordingly, the data lines DL may be electrically connected to the signal pads DP-PD through the driving chip.

The display panel DP may include the pixel region DP-PX and the peripheral region DP-SA, when viewed in a plan view. The pixel region DP-PX may be a region, on which the pixels PX are provided, and the peripheral region DP-SA may be a region, on which the pixels PX are not provided.

According to some example embodiments, the peripheral region DP-SA may be defined along an edge or circumference of the pixel region DP-PX. The pixel region DP-PX may be a region having a larger area than the display region DD-DA shown in FIG. 1, and the peripheral region DP-SA may be a region having a smaller area than the non-display region DD-NDA shown in FIG. 1. The driving circuit GDC, the signal pads DP-PD, and some signal lines may be provided on the peripheral region DP-SA. The power line PL may be used to supply a power voltage to organic light emitting diodes of the pixels PX. The power line PL may be electrically connected to anodes of the organic light emitting diodes.

FIG. 6 illustrates a scan line GL, a data line DL, a power line PL, and a pixel PX connected thereto. The structure of the pixel PX is not limited to the example of FIG. 6 and may be variously changed.

An organic light emitting diode OLED may be a top-emission type diode or a bottom-emission type diode. The pixel PX may include a first transistor T1 (or a switching transistor), a second transistor T2 (or a driving transistor), and a capacitor Cst, which are used as parts of a pixel driving circuit for driving the organic light emitting diode OLED. A first power voltage ELVDD may be provided to the second transistor T2, and a second power voltage ELVSS may be provided to the organic light-emitting diode OLED. The second power voltage ELVSS may be lower than the first power voltage ELVDD.

The first transistor T1 may be configured to output a data signal applied to the data line DL, in response to a scan signal applied to the scan line GL. The capacitor Cst may be charged to have a voltage corresponding to a data signal received from the first transistor T1. The second transistor T2 may be connected to the organic light emitting diode OLED. The second transistor T2 may be used to control a driving current flowing through the organic light-emitting diode OLED, in response to an amount of electric charges stored in the capacitor Cst.

The equivalent circuit in FIG. 6 is just one of possible equivalent circuits of the pixel, but the inventive concept is not limited thereto. The pixel PX may be configured to further include at least one transistor or at least one capacitor. In certain embodiments, the organic light emitting diode OLED may be provided between and coupled to the power line PL and the second transistor T2.

FIG. 7 is a sectional view illustrating a portion of the display panel DP corresponding to the equivalent circuit diagram of FIG. 6.

The circuit device layer DP-CL, the display element layer DP-OLED, and the thin-film encapsulation layer TFE may be sequentially provided on the base layer BL. In the present embodiment, the circuit device layer DP-CL may include a buffer layer BFL, a first intermediate inorganic layer 10, and a second intermediate inorganic layer 20, which are formed of inorganic materials, and an intermediate organic layer 30, which is formed of an organic material. The inorganic and organic materials are not limited to specific materials, and in certain embodiments, the buffer layer BFL may be selectively provided or may be omitted.

A semiconductor pattern OSP1 of the first transistor T1 (hereinafter, a first semiconductor pattern) and a semiconductor pattern OSP2 of the second transistor T2 (hereinafter, a second semiconductor pattern) may be provided on the buffer layer BFL. The first semiconductor pattern OSP1 and the second semiconductor pattern OSP2 may be formed of or include at least one of amorphous silicon, poly silicon, or metal oxide semiconductor materials.

The first intermediate inorganic layer 10 may be provided on the first semiconductor pattern OSP1 and the second semiconductor pattern OSP2. A control electrode GE1 of the first transistor T1 (hereinafter, a first control electrode) and a control electrode GE2 of the second transistor T2 (hereinafter, a second control electrode) may be provided on the first intermediate inorganic layer 10. The first control electrode GE1 and the second control electrode GE2 may be fabricated by the same photolithography process as that for the scan lines GL (e.g., see FIG. 5A).

The second intermediate inorganic layer 20 may be provided on the first intermediate inorganic layer 10 to cover the first control electrode GE1 and the second control electrode GE2. An input electrode DE1 and an output electrode SE1 of the first transistor T1 (hereinafter, a first input electrode and a first output electrode) and an input electrode DE2 and an output electrode SE2 of the second transistor T2 (hereinafter, a second input electrode and a second output electrode) may be provided on the second intermediate inorganic layer 20.

The first input electrode DE1 and the first output electrode SE1 may be respectively connected to the first semiconductor pattern OSP1 through a first penetration hole CH1 and a second penetration hole CH2, which are formed to penetrate the first intermediate inorganic layer 10 and the second intermediate inorganic layer 20. The second input electrode DE2 and the second output electrode SE2 may be respectively connected to the second semiconductor pattern OSP2 through a third penetration hole CH3 and a fourth penetration hole CH4, which are formed to penetrate the first intermediate inorganic layer 10 and the second intermediate inorganic layer 20. In certain embodiments, at least one of the first transistor T1 and the second transistor T2 may be provided to have a bottom gate structure.

The intermediate organic layer 30 may be provided on the second intermediate inorganic layer 20 to cover the first input electrode DE1, the second input electrode DE2, the first output electrode SE1, and the second output electrode SE2. The intermediate organic layer 30 may be provided to have a flat surface (e.g., a flat top surface).

The display element layer DP-OLED may be provided on the intermediate organic layer 30. The display element layer DP-OLED may include a pixel definition layer PDL and an organic light emitting diode OLED. The pixel definition layer PDL may be formed of or include an organic material. A first electrode AE may be provided on the intermediate organic layer 30. The first electrode AE may be connected to the second output electrode SE2 through a fifth penetration hole CH5 penetrating the intermediate organic layer 30. An opening OP may be defined in the pixel definition layer PDL. The opening OP of the pixel definition layer PDL may be provided to expose at least a portion of the first electrode AE. In certain embodiments, the pixel definition layer PDL may be omitted.

The pixel PX may be placed in a pixel region DP-PX (refer to FIG. 5A). The pixel region DP-PX may include a light-emitting region PXA and a non-light-emitting region NPXA adjacent to the light-emitting region PXA. The non-light-emitting region NPXA may be provided to enclose the light-emitting region PXA. In the present embodiments, the light-emitting region PXA may be defined to correspond to a region of the first electrode AE exposed by the opening OP.

In certain embodiments, the light-emitting region PXA may be overlapped with at least one of the first and second transistors T1 and T2. Therefore, the opening OP may be enlarged more than an area shown in FIG. 7. Moreover, not only the first electrode AE but also a light emitting layer EML to be described below may be enlarged more than an area shown in FIG. 7.

A hole control layer HCL may be provided in common on the light-emitting region PXA and the non-light-emitting region NPXA. Although not shown, a common layer, such as the hole control layer HCL, may be provided in common in a plurality of the pixels PX (e.g., see FIG. 5A).

The light emitting layer EML may be provided on the hole control layer HCL. The light emitting layer EML may be provided on a region corresponding to the opening OP. In other words, the light emitting layer EML may include a plurality of isolated patterns, each of which is provided for a corresponding one of the pixels PX. The light emitting layer EML may include an organic material and/or an inorganic material. The light emitting layer EML may be configured to generate a specific color light.

In the present embodiment, the light emitting layer EML is illustrated to have a patterned structure, but in certain embodiments, the light emitting layer EML may be extended to span a plurality of the pixels PX. Here, the light emitting layer EML may be configured to generate a white-color light. Also, the light emitting layer EML may have a multi-layered structure called 'tandem'.

An electron control layer ECL may be provided on the light emitting layer EML. Although not shown, the electron control layer ECL may be provided in common in the plurality of pixels PX (e.g., see FIG. 5A). A second electrode CE may be provided on the electron control layer ECL. The second electrode CE may be provided in common on a plurality of the pixels PX.

The thin-film encapsulation layer TFE may be provided on the second electrode CE. The thin-film encapsulation layer TFE may be provided in common on a plurality of the pixels PX. In the present embodiment, the thin-film encapsulation layer TFE may be provided to directly cover the second electrode CE. In some embodiments, a capping layer may be provided between the thin-film encapsulation layer TFE and the second electrode CE to cover the second electrode CE. Here, the thin-film encapsulation layer TFE may be provided to directly cover the capping layer.

In some embodiments, the organic light emitting diode OLED may further include a resonance structure, which is used to control a resonance distance of light emitted from the light emitting layer EML. The resonance structure may be provided between the first electrode AE and the second electrode CE, and a thickness of the resonance structure may be determined, depending on a wavelength of light to be emitted from the light emitting layer EML.

Figure 8:
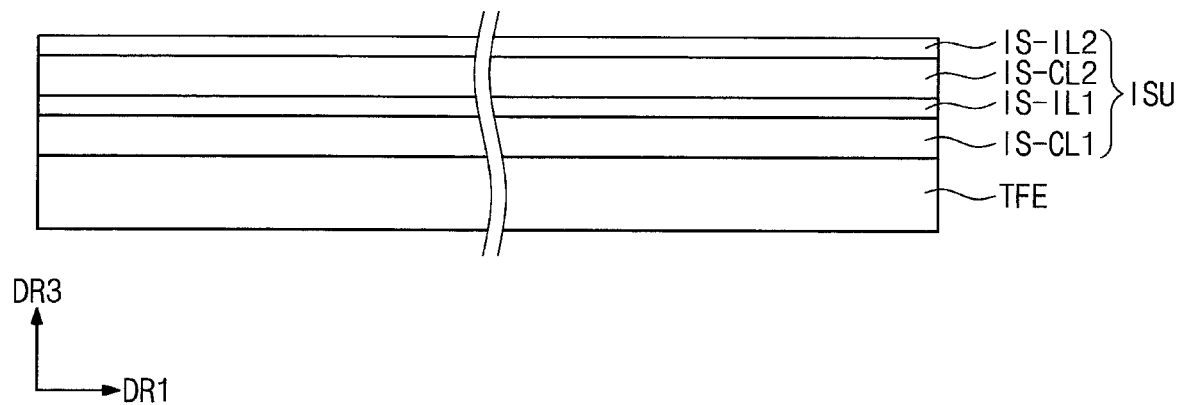
FIG. 8 is a sectional view illustrating an input sensing unit according to some example embodiments.
Figure 9:
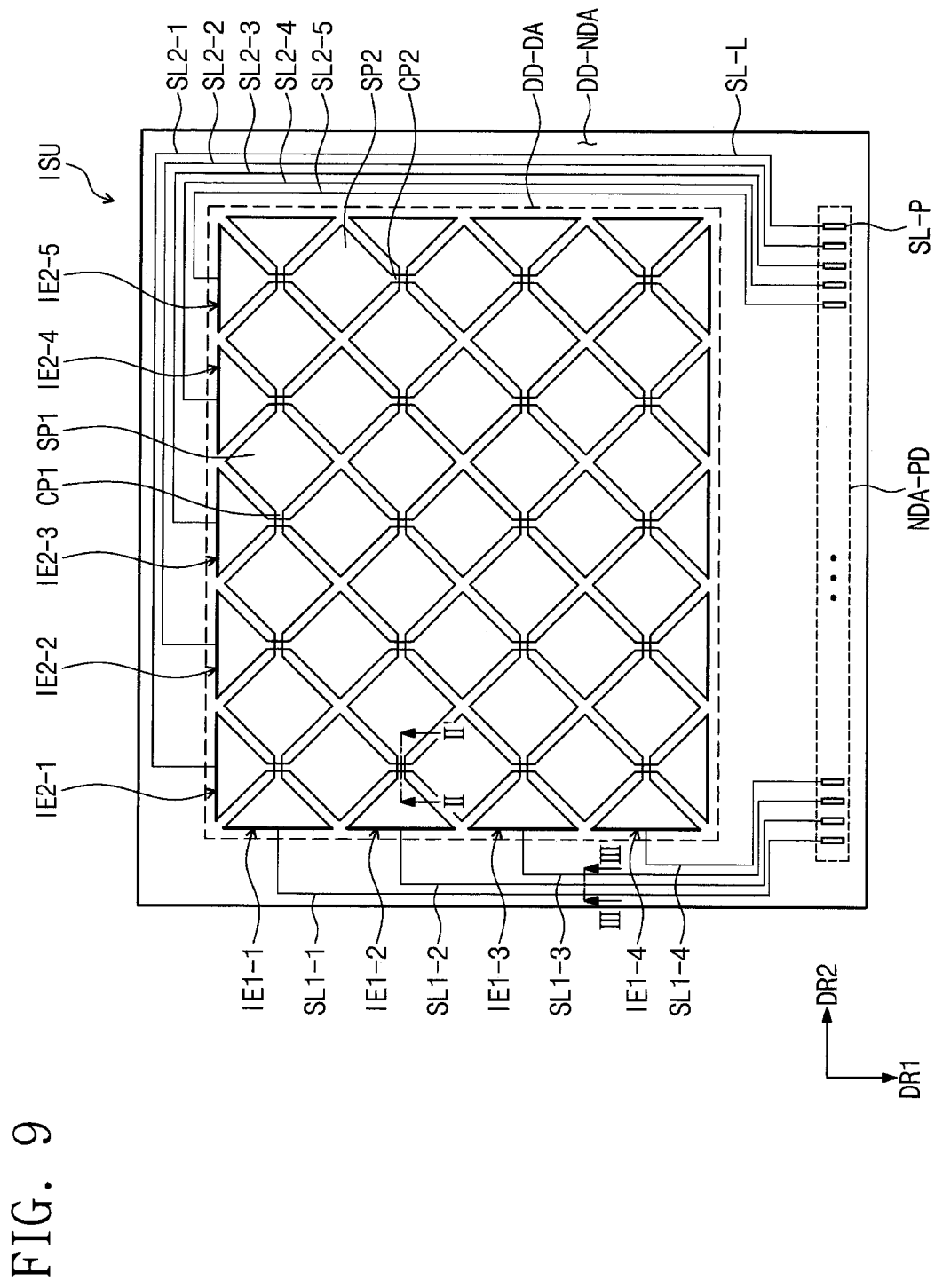
FIG. 9 is a plan view illustrating an input sensing unit according to some example embodiments.
Figure 10A:
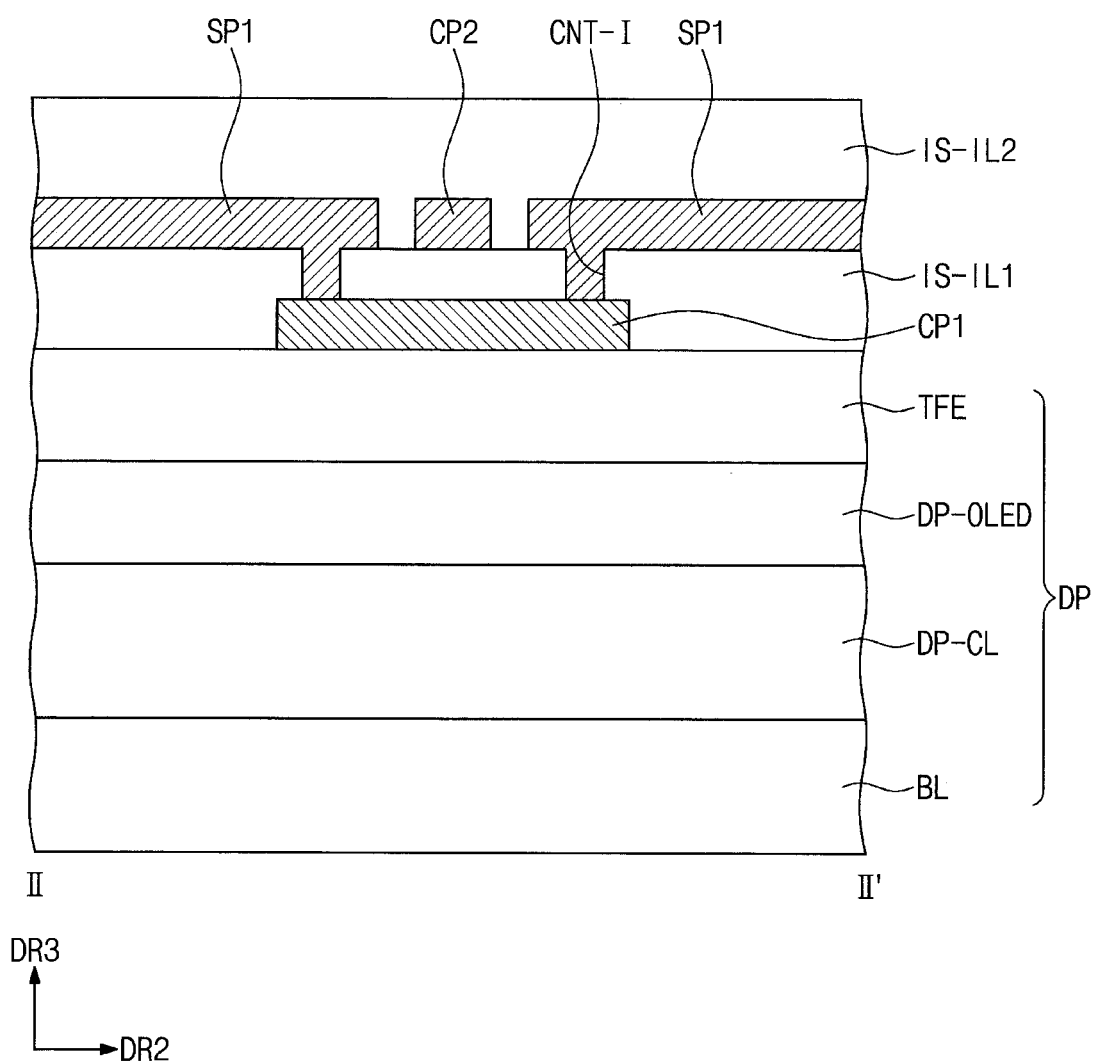
FIG. 10A is a first sectional view illustrating an input sensing unit according to some example embodiments.
Figure 10B:
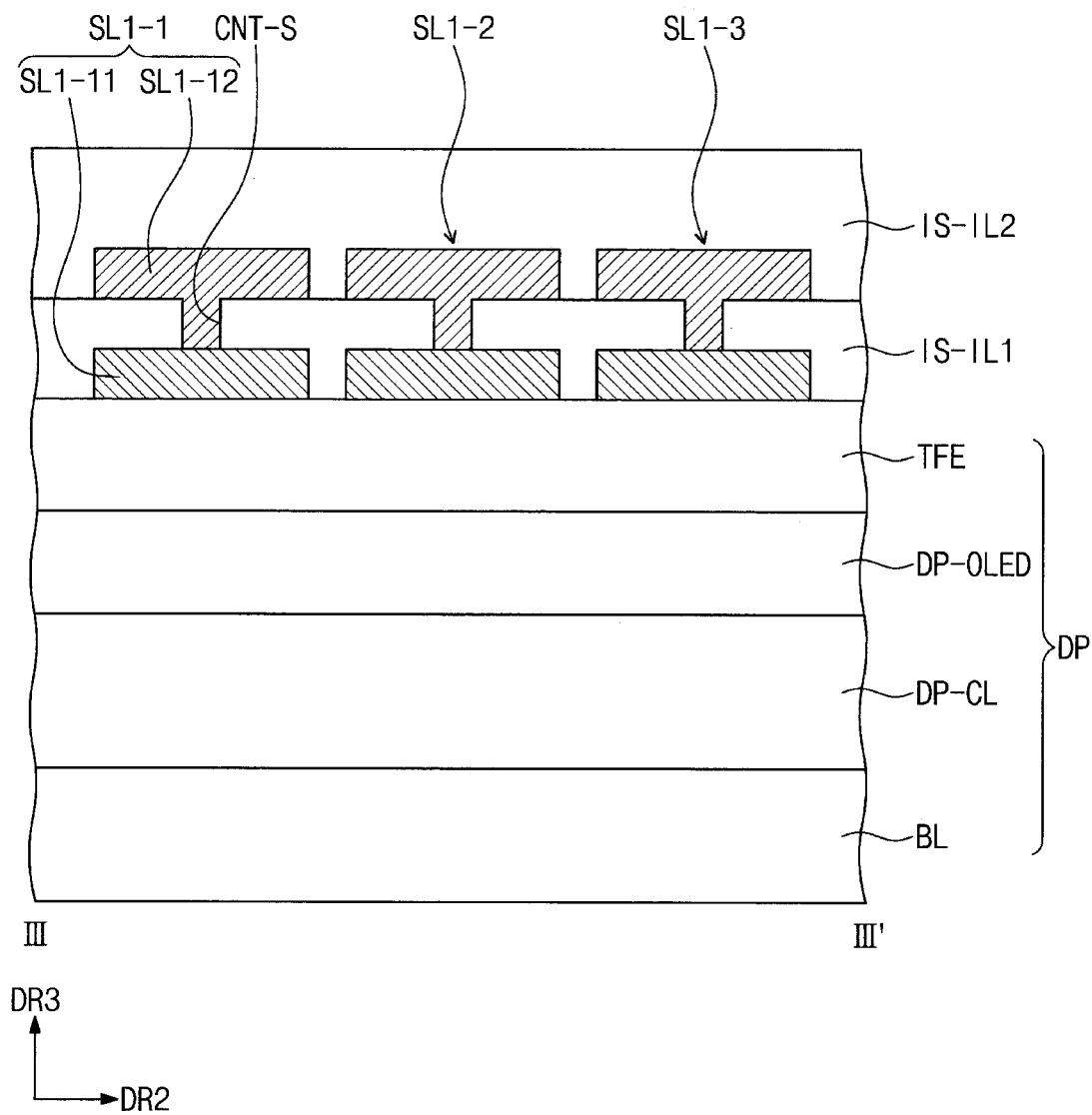
FIG. 10B is a second sectional view illustrating an input sensing unit according to some example embodiments.

FIG. 8 is a sectional view illustrating an input sensing unit ISU according to some embodiments of the inventive concept. FIG. 9 is a plan view illustrating the input sensing unit ISU according to some embodiments of the inventive concept. FIG. 10A is a first sectional view illustrating the input sensing unit ISU according to some example embodiments. FIG. 10B is a second sectional view illustrating the input sensing unit ISU according to some example embodiments.

FIGS. 8 to 10B illustrate an example in which the input sensing unit is provided in the form of a layer-type input sensing unit described with reference to FIGS. 3A to 3F. Furthermore, as additionally shown in FIG. 8, the thin-film encapsulation layer TFE may be used as a base surface.

The input sensing unit ISU may have a multi-layered structure, regardless of its shape. For example, the input sensing unit ISU may include a sensing electrode, a signal line connected to the sensing electrode, and at least one insulating layer. The input sensing unit ISU may be configured to sense an external input, for example, using a capacitance-sensing method. The inventive concept is not limited to a specific sensing method of the input sensing unit ISU, and in certain embodiments, the input sensing unit ISU may be configured to sense an external input in an electromagnetic induction manner or a pressure-sensing manner.

As shown in FIG. 8, the input-sensing unit ISU may include a first conductive layer IS-CL1, a first insulating layer IS-IL1, a second conductive layer IS-CL2, and a second insulating layer IS-IL2. Each of the first and second conductive layers IS-CL1 and IS-CL2 may have a single-layered structure or may have a multi-layered structure including a plurality of layers stacked in the third direction DR3. The conductive layer of the single-layered structure may be formed of or include a metal layer or a transparent conductive layer. The metal layer may include at least one of molybdenum, silver, titanium, copper, aluminum, or alloys thereof. The transparent conductive layer may include transparent conductive oxide, such as indium tin oxide (ITO), indium zinc oxide (IZO), zinc oxide (ZnO), or indium tin zinc oxide (ITZO). In certain embodiments, the transparent conductive layer may include a conductive polymer (e.g., PEDOT), metal nanowires, or graphene.

In the case where the conductive layer has the multi-layered structure, the conductive layer may include a plurality of metal layers. For example, the conductive layer may be a triple layered structure including a titanium layer, an aluminum layer, and a titanium layer. The conductive layer of the multi-layered structure may include at least one metal layer and at least one transparent conductive layer.

Each of the first and second conductive layers IS-CL1 and IS-CL2 may include a plurality of patterns. The description that follows will refer to an example in which the first conductive layer IS-CL1 includes first conductive patterns and the second conductive layer IS-CL2 includes second conductive patterns. Each of the first and second conductive patterns may include sensing electrodes and signal lines.

A stacking structure and a material of the sensing electrode may be determined in consideration of technical requirements on sensing sensitivity. The sensing sensitivity may be affected by RC delay, and the metal layer may have electric resistance lower than that of the transparent conductive layer. Thus, it may be possible to reduce a RC delay value of the sensing electrodes and to reduce a charging time taken to charge a capacitor defined between the sensing electrodes. By contrast, in the case where the sensing electrodes are formed of the transparent conductive layer, they may not be easily recognized by a user, compared with the sensing electrodes formed of the metal layer, and thus, it may be possible to increase an input area and an effective capacitance.

To prevent the sensing electrodes or the metal layer from being recognized by a user, the sensing electrodes may be provided in a mesh shape. A thickness of the thin-film encapsulation layer TFE may be adjusted to prevent the input sensing unit ISU from being affected by noise caused by elements of the display element layer DP-OLED. Each of the first and second insulating layers IS-IL1 and IS-IL2 may have a single- or multi-layered structure. Each of the first and second insulating layers IS-IL1 and IS-IL2 may be formed of or include an inorganic material, an organic material, or a composite material.

At least one of the first and second insulating layers IS-IL1 and IS-IL2 may include an inorganic layer. The inorganic layer may be formed of or include at least one of aluminum oxide, titanium oxide, silicon oxide, silicon oxynitride, zirconium oxide, or hafnium oxide.

At least one of the first and second insulating layers IS-IL1 and IS-IaL2 may include an organic layer. The organic layer may be formed of or include at least one of acrylic resins, methacryl resins, polyisoprene resins, vinyl resins, epoxy resins, urethane resins, cellulose resins, siloxane resins, polyimide resins, polyamide resins, or perylene resins.

As shown in FIG. 9, the input sensing unit ISU may include first sensing electrodes IE1-1 to IE1-4, first signal lines SL1-1 to SL1-4 connected to the first sensing electrodes IE1-1 to IE1-4, second sensing electrodes IE2-1 to IE2-5, and second signal lines SL2-1 to SL2-5 connected to the second sensing electrodes IE2-1 to IE2-5. Although not shown, the input sensing unit ISU may further include an optical dummy electrode provided in a boundary region between the first sensing electrodes IE1-1 to IE1-4 and the second sensing electrodes IE2-1 to IE2-5.

The first sensing electrodes IE1-1 to IE1-4 may be provided to cross the second sensing electrodes IE2-1 to IE2-5. The first sensing electrodes IE1-1 to IE1-4 may be arranged in the first direction DR1 and each of them may extend in the second direction DR2. The first and second sensing electrodes IE1-1 to IE1-4 and IE2-1 to IE2-5 may be configured to sense an external input in a mutual-capacitance manner and/or a self-capacitance manner. In some embodiments, during a first period, coordinates of an external input may be obtained in the mutual-capacitance manner, and during a second period, coordinates of the external input may be re-obtained in the self-capacitance manner.

Each of the first sensing electrodes IE1-1 to IE1-4 may include first sensor portions SP1 and first connecting portions CP1. Each of the second sensing electrodes IE2-1 to IE2-5 may include second sensor portions SP2 and second connecting portions CP2. Two of the first sensor portions SP1, which are located at opposite ends of the first sensing electrode, may have a small area or size (e.g., half area), compared with a central one of the first sensor portions SP1. Two of the second sensor portions SP2, which are located at opposite ends of the second sensing electrode, may have a small area or size (e.g., half area), compared with a central one of the second sensor portions SP2.

FIG. 9 illustrates the first sensing electrodes IE1-1 to IE1-4 and the second sensing electrodes IE2-1 to IE2-5, according to some embodiments of the inventive concept, but the inventive concept is not limited to specific shapes thereof. In some embodiments, the first sensing electrodes IE1-1 to IE1-4 and the second sensing electrodes IE2-1 to IE2-5 may have a shape (e.g., a bar shape), in which the sensor portion and the connecting portion are not differentiated from each other. The first sensor portions SP1 and the second sensor portions SP2 are illustrated to have a diamond-like shape, but the inventive concept is not limited thereto. For example, each of the first and second sensor portions SP1 and SP2 may be provided to have one of other polygonal shapes.

In one or each of the first sensing electrodes, the first sensor portions SP1 may be arranged in the second direction DR2, and in one or each of the second sensing electrodes, the second sensor portions SP2 may be arranged in the first direction DR1. Each of the first connecting portions CP1 may be provided to connect adjacent ones of the first sensor portions SP1 to each other, and each of the second connecting portions CP2 may be provided to connect adjacent ones of the second sensor portions SP2 to each other.

The first signal lines SL1-1 to SL1-4 may be connected to ends of the first sensing electrodes IE1-1 to IE1-4, respectively. The second signal lines SL2-1 to SL2-5 may be connected to ends of the second sensing electrodes IE2-1 to IE2-5. In some embodiments, the first signal lines SL1-1 to SL1-4 may further include signal lines connected to opposite ends of the first sensing electrodes IE1-1 to IE1-4.

Each of the first signal lines SL1-1 to SL1-4 and the second signal lines SL2-1 to SL2-5 may include a line portion SL-L and a pad portion SL-P. The pad portions SL-P may be arranged in a pad region NDA-PD. Although not shown, the input sensing unit ISU may include dummy signal pads, which are correspondingly connected to the signal pads DP-PD shown in FIG. 5A.

As shown in FIGS. 9, 10A, and 10B, the first conductive layer IS-CL1 may include the first connecting portions CP1. In addition, the first conductive layer IS-CL1 may include first line portions of the first signal lines SL1-1 to SL1-4 (e.g., first line portions SL1-11 of the first signal lines SL1-1).

The first connecting portions CP1 and the first line portions of the first signal lines SL1-1 to SL1-4 may be formed by the same process. The first connecting portions CP1 and the first line portions of the first signal lines SL1-1 to SL1-4 may include the same material and may have the same stacking structure. However, embodiments of the present disclosure are not limited thereto, and for example, the first connecting portions CP1 may be formed by a process that is different from that for the first line portions of the first signal lines SL1-1 to SL1-4. In certain embodiments, the first line portions of the first signal lines SL1-1 to SL1-4 may be provided to have the same stacking structure each other, but the first connecting portions CP1 may be provided to have a stacking structure different from that of the first line portions of the first signal lines SL1-1 to SL1-4.

The second conductive layer IS-CL2 may include the first sensor portions SP1, the second sensor portions SP2, and the second connecting portions CP2. In addition, the second conductive layer IS-CL2 may include second line portions of the first signal lines SL1-1 to SL1-4 (e.g., second line portions SL1-12 of the first signal lines SL1-1).

The first insulating layer IS-IL1 may be provided to define first connection contact holes CNT-I and second connection contact holes CNT-S. Here, the first connection contact holes CNT-I may be provided to partially expose the first connecting portions CP1, and the second connection contact holes CNT-S may be provided to partially expose the first line portions of the first signal lines SL1-1 to SL1-4. The first connecting portion CP1 may be connected to the first sensor portions SP1 through the first connection contact holes CNT-I. The first line portion SL1-11 may be connected to the second line portion SL1-12 through the second connection contact hole CNT-S.

In some embodiments, the first conductive layer IS-CL1 may include the second connecting portions CP2. Here, the first connecting portions CP1 may be formed from the second conductive layer IS-CL2. Accordingly, each of the first sensing electrodes IE1-1 to IE1-4 may have a single body shape.

In some embodiments, the first conductive layer IS-CL1 may include the first sensor portions SP1, the second sensor portions SP2, and the second connecting portions CP2. Here, the second conductive layer IS-CL2 may include the first connecting portions CP1.

The first insulating layer IS-IL1 may be provided to cover the first connecting portions CP1 and may be used to electrically disconnect the first connecting portions CP1 from the second connecting portions CP2. Accordingly, the first insulating layer IS-IL1 may include a plurality of insulating patterns, which are provided at intersections of the sensing electrodes. In some embodiments, one of the first line portion SL1-11 and the second line portion SL1-12 may be omitted.

In some embodiments, the first conductive layer IS-CL1 may include the first sensor portions SP1 and the first connecting portions CP1. Here, the second conductive layer IS-CL2 may include the second sensor portions SP2 and the second connecting portions CP2.

In some embodiments, the input sensing unit ISU may include the first conductive layer IS-CL1 and the first insulating layer IS-IL1. Here, the sensing electrodes may be arranged to be spaced apart from each other (e.g., in a dotted or matrix shape). Signal lines may be connected to the sensing electrodes, respectively. The input sensing unit ISU may be configured to sense an external input in a self-capacitance manner.

Figure 11A:
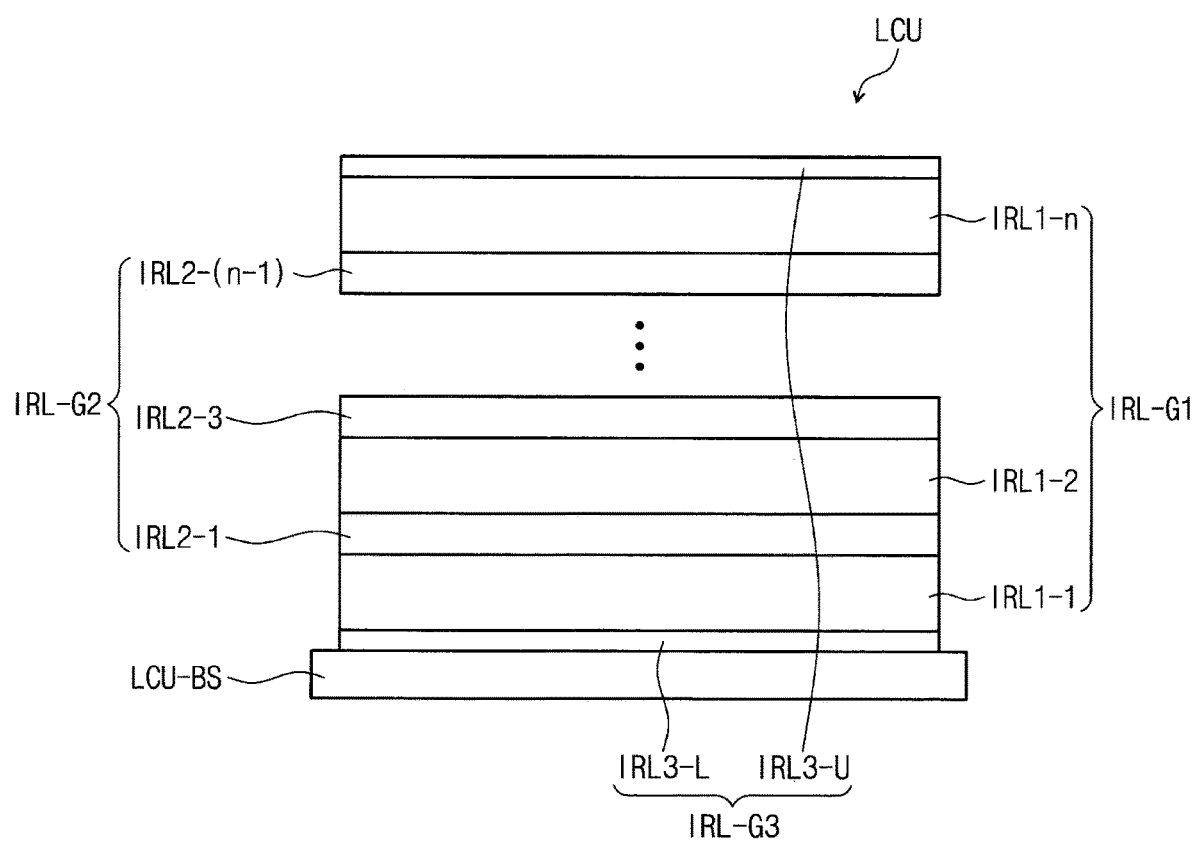
FIG. 11A is a sectional view illustrating a optical control unit according to some example embodiments.
Figure 11B:
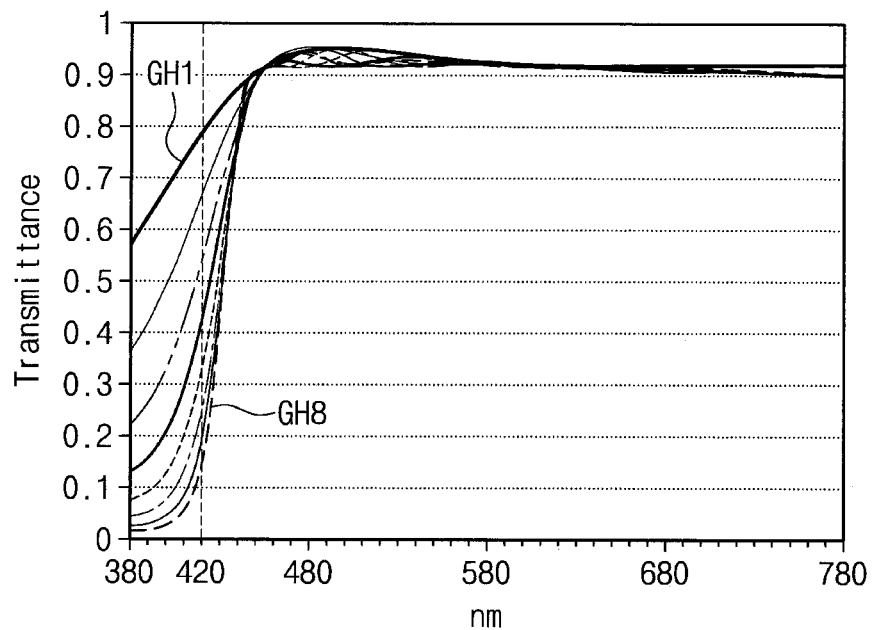
FIG. 11B is a graph showing a change in transmittance of a natural light, which is caused by a change in stacking structure of a optical control unit according to some example embodiments.
Figure 11C:
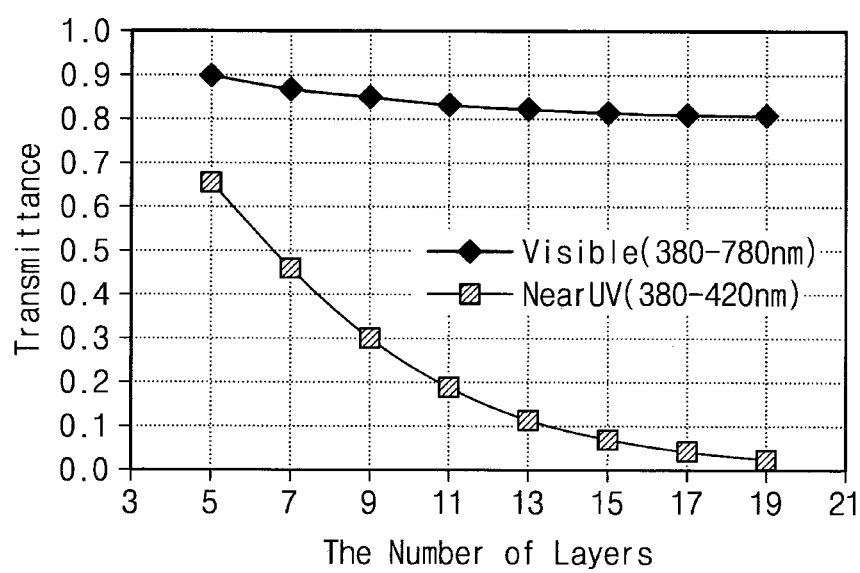
FIG. 11C is a graph showing a change in transmittance of a natural light, which is caused by a change in stacking structure of a optical control unit according to some example embodiments.
Figure 11D:
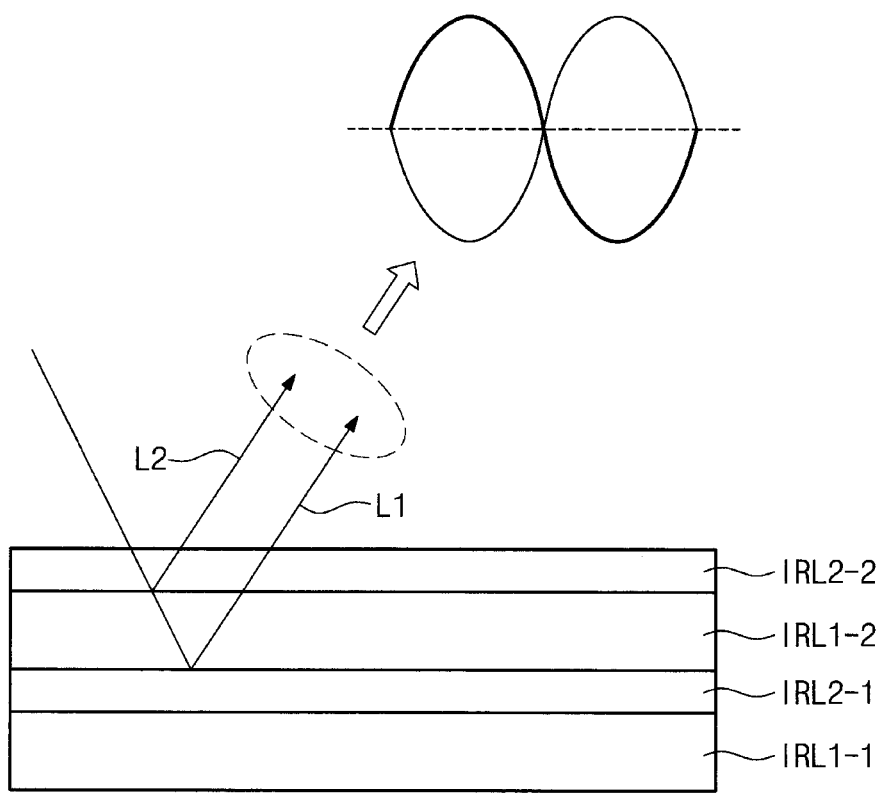
FIG. 11D is a diagram showing paths of lights reflected by a optical control unit according to some example embodiments.
Figure 11E:
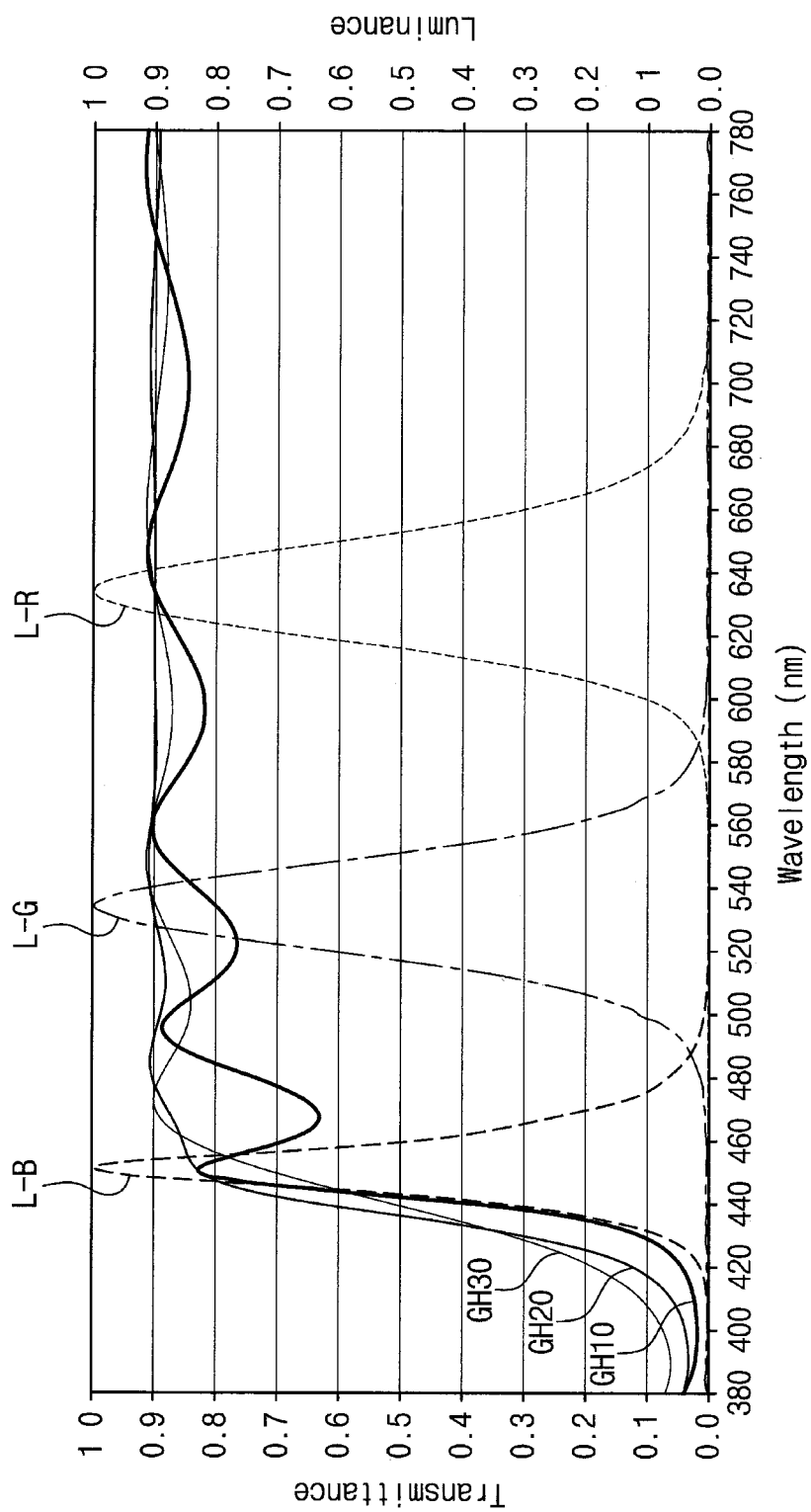
FIG. 11E is a graph showing transmittance characteristics of light beams transmitting through a optical control unit according to some example embodiments.

FIG. 11A is a sectional view of a optical control unit LCU according to some example embodiments. FIG. 11B is a graph showing a change in transmittance of a natural light, which is caused by a change in stacking structure of the optical control unit LCU according to some example embodiments. FIG. 11C is a graph showing a change in transmittance of a natural light, which is caused by a change in stacking structure of the optical control unit LCU according to some example embodiments. FIG. 11D is a diagram showing paths of lights reflected by the optical control unit LCU according to some example embodiments. FIG. 11E is a graph showing transmittance characteristics of light beams transmitting through the optical control unit LCU according to some example embodiments. FIGS. 11F to 11I are graphs showing a change in transmittance of light passing through the optical control unit LCU, which is caused when there is a change of a third layer group.

As shown in FIG. 11A, the optical control unit LCU may include a first layer group IRL-G1, a second layer group IRL-G2, and a third layer group IRL-G3, which are provided on a base layer LCU-BS.

The first layer group IRL-G1 may include n first refractive index layers IRL1-1 to IRL1-$n$. Here, n is a natural number of 2 or larger. The second layer group IRL-G2 may include a plurality of second refractive index layers IRL2-1 to IRL2-(n−1), each of which is provided between a corresponding pair of the first refractive index layers IRL1-1 to IRL1-$n$. In the present embodiment, the second layer group IRL-G2 may include (n−1) second refractive index layers IRL2-1 to IRL2-(n−1) whose number is less than the number of the layers constituting the first layer group IRL-G1.

In some embodiments, the second layer group IRL-G2 may be configured to include second refractive index layers whose number is the same as the number of the first refractive index layers IRL1-1 to IRL1-$n$.

The first refractive index layers IRL1-1 to IRL1-$n$ may be provided to have the same thickness and the same refractive index. For example, the first refractive index layers IRL1-1 to IRL1-$n$ may be formed of or include the same material. The second refractive index layers IRL2-1 to IRL2-(n−1) may be provided to have the same thickness and the same refractive index. For example, the second refractive index layers IRL2-1 to IRL2-(n−1) may be formed of or include the same material. The first layer group IRL-G1 and the second layer group IRL-G2 may be configured to have refractive indices that are different from each other.

The first refractive index layers IRL1-1 to IRL1-$n$ and the second refractive index layers IRL2-1 to IRL2-(n−1), which are alternately stacked on the base layer LCU-BS, may be configured to serve as a band-pass filter or an angular filter. The larger a difference in refractive index between the first layer group IRL-G1 and the second layer group IRL-G2, the higher a blocking ratio or reflectance of a natural light, and in this case, a width of the to-be-blocked specific wavelength range may be increased. If the difference in refractive index between the first and second layer groups IRL-G1 and IRL-G2 is small, a stacking number may be increased to increase the blocking ratio. However, in this case, the width of the specific wavelength range may be decreased.

In the present embodiment, one group of the first and second layer groups IRL-G1 and IRL-G2 may have a refractive index ranging from 1.4 to 1.6. One group of the first and second layer groups IRL-G1 and IRL-G2 may have a refractive index ranging from 1.9 to 2.1. The refractive indices of the refractive index layers may have an error within the above range, depending on deposition condition of a layer.

The refractive index layers of one group of the first and second layer groups IRL-G1 and IRL-G2 may include one of silicon oxynitride, silicon nitride, and silicon oxide, and the other group may include the other of silicon oxynitride, silicon nitride, and silicon oxide. In the present embodiment, the first layer group IRL-G1 may include silicon oxide layers, and the second layer group IRL-G2 may include silicon nitride layers.

As shown in FIGS. 11B and 11C, the larger the stacking number, the lower the transmittance of the specific wavelength range. A first graph GH1 shows transmittance characteristics of the optical control unit LCU provided in a five-layered structure, and an eighth graph GH8 shows transmittance characteristics of an optical structure provided in a nineteen-layered structure. Other graphs between the first and eighth graphs GH1 and GH8 show transmittance characteristics of optical structures provided in seven to seventeen-layered structures. The optical control units LCU having transmittance characteristics shown in FIGS. 11B and 11C may have the structure shown in FIG. 11A, but the optical control units LCU may have a variation in stacking structure of the first and second layer groups IRL-G1 and IRL-G2. The optical control unit LCU provided in the five-layered structure may include two first refractive index layers, one second refractive index layer therebetween, and two first refractive index layers provided at the uppermost and lowermost levels.

In the optical structure, a silicon oxide layer having a refractive index of 1.497 and a thickness of 684 Å is used as the first refractive index layer, and a silicon nitride layer having a refractive index of 1.998 and a thickness of 462 Å is used as the second refractive index layer. A silicon nitride layer having a refractive index of 1.998 and a thickness of 231 Å is used as the third refractive index layer.

In other words, the optical structure having the five-layered structure is provided to include a 231 Å-thick silicon nitride layer having a refractive index of 1.998, a 684 Å-thick silicon oxide layer having a refractive index of 1.497, a 462 Å-thick silicon nitride layer having a refractive index of 1.998, a 684 Å-thick silicon oxide layer having a refractive index of 1.497, and a 231 Å-thick silicon nitride layer having a refractive index of 1.998, which are sequentially stacked on the base layer LCU-BS. A central wavelength of the optical structure is set to 400 nm.

According to some example embodiments, the optical structure may be configured to block light whose wavelength ranges from 390 nm to 420 nm. Generally, when a display device is exposed to a natural light for a long time, it is found that a pixel failure occurs. In the case where the organic layer (e.g., a light emitting layer) of the organic light emitting diode described with reference to FIG. 7 is exposed to a natural light for a long time, a shrinkage phenomenon may occur, and in particular, it is found that the shrinkage of the organic layer is most greatly affected by light having a wavelength range of 390 nm to 420 nm. FIG. 5B shows pixels PX-R, PX-G, PX-B that having reduced light-emitting areas by shrinkage of the organic layer. The reduced light-emitting areas corresponds to an inner dotted line. Because the afore-described optical structure is used in the display device, it may be possible to effectively block a fraction of the natural light having a wavelength of 390 nm to 420 nm and thereby to prevent the pixel failure from occurring.

To prevent or reduce the pixel failure, the optical structure may be configured to allow light, whose wavelength ranges from 390 nm to 420 nm, to pass therethrough with a transmission ratio of about 30% or lower. To display an image generated by the display panel DP to the outside, the optical structure may be configured to allow a natural light to pass therethrough with a transmission ratio of about 80% or higher. To satisfy both of the conditions, the optical structure according to the present embodiment is preferably configured to have 11 or more layers, and here, the stacking structure of the first refractive index layer and the second refractive index layer is preferably configured to have 9 or more layers. The stacking number of the refractive index layers of the optical structure may be slightly increased or decreased depending on the refractive index of the refractive index layers.

As shown in FIG. 11D, in order to prevent the first light L1 and the second light L2 reflected by the first layer group IRL-G1 and the second layer group IRL-G2 from propagating toward a user or to extinguish the first light L1 and the second light L2 through destructive interference, it is preferred that the first refractive index layers IRL1-1 to IRL1-$n$ are configured to satisfy the condition given by the following equation 1 and the second refractive index layers IRL2-1 to IRL2-(n−1) are configured to satisfy the condition given by the following equation 2.

$$\overline{2Ta} = \left(m + \frac{1}{2}\right) \times \frac{\lambda}{n1} \quad \text{Equation 1}$$

$$\overline{2Tb} = \left(m + \frac{1}{2}\right) \times \frac{\lambda}{n2} \quad \text{Equation 2}$$

where $\lambda$ denotes a wavelength that is within a specific wavelength range to be blocked and ranges from 390 nm to 420 nm, and m is zero and a natural number. Ta is a thickness of each of the first refractive index layers IRL1-1 to IRL1-$n$, and Tb is a thickness of each of the second refractive index layers IRL2-1 to IRL2-(n−1). N1 is a refractive index of each of the first refractive index layers IRL1-1 to IRL1-$n$ at the wavelength $\lambda$, and n2 is a refractive index of each of the second refractive index layers IRL2-1 to IRL2-(n−1) at the wavelength $\lambda$.

Even if each of the first refractive index layers IRL1-1 to IRL1-$n$ does not have a thickness satisfying the equation 1, it may have an error ranging from −5% to +5% with respect to the thickness given by the equation 1, and even if each of the second refractive index layers IRL2-1 to IRL2-(n−1) does not have a thickness satisfying the equation 2, it may preferably have an error ranging from −5% to +5% with respect to the thickness given by the equation 2.

If the first refractive index layers IRL1-1 to IRL1-$n$ and the second refractive index layers IRL2-1 to IRL2-(n−1) are thinner than the thickness given by the equation, the graphs of FIG. 11B may be shifted to the left, and if the first refractive index layers IRL1-1 to IRL1-$n$ are thicker than the thickness given by the equation 1, the graphs of FIG. 11B may be shifted to the right. The third layer group IRL-G3 may include an optical compensation layer, which is provided on the uppermost refractive index layer of the first and second refractive index layers IRL1-1 to IRL1-$n$ and IRL2-1 to IRL2-(n−1) and is in the uppermost refractive index layer, or which is provided below the lowermost refractive index layer and is in contact with the lowermost refractive index layer.

FIG. 11A illustrate both of a lower optical compensation layer IRL3-L, which is provided between the lowermost first refractive index layer IRL1-1 and the base layer LCU-BS, and an upper optical compensation layer IRL3-U, which is provided to be in contact with the uppermost first refractive index layer IRL1-$n$. In certain embodiments, only one of the lower optical compensation layer IRL3-L and the upper optical compensation layer IRL3-U may be provided.

The lower optical compensation layer IRL3-L may have a refractive index that is different from that of the lowermost refractive index layer (e.g., the lowermost first refractive index layer IRL1-1 in the present embodiment). For example, the lower optical compensation layer IRL3-L may be formed of or include a material that is different from the lowermost first refractive index layer IRL1-1.

The lower optical compensation layer IRL3-L may have the same refractive index as that of a refractive index layer (e.g., the lowermost second refractive index layer IRL2-1 in the present embodiment) directly provided on the lowermost refractive index layer. For example, the lower optical compensation layer IRL3-L may be formed of or include the same material as that of the refractive index layer (e.g., the lowermost second refractive index layer IRL2-1 in the present embodiment) directly provided on the lowermost refractive index layer.

The upper optical compensation layer IRL3-U may have a refractive index that is different from that of the uppermost refractive index layer (e.g., the uppermost first refractive index layer IRL1-$n$ in the present embodiment). For example, the upper optical compensation layer IRL3-U may be formed of or include a material that is different from the uppermost first refractive index layer IRL1-$n$. The upper optical compensation layer IRL3-U may have the same refractive index as that of a refractive index layer (e.g., the uppermost second refractive index layer IRL2-(n−1) in the present embodiment) directly provided under the uppermost refractive index layer. The upper optical compensation layer IRL3-U may be formed of or include the same material as that of the refractive index layer (e.g., the uppermost second refractive index layer IRL2-(n−1) in the present embodiment) directly provided under the uppermost refractive index layer.

Each of the optical compensation layers IRL3-L and IRL3-U may have a thickness that is less than that of the first refractive index layers IRL1-1 to IRL1-$n$ and the second refractive index layers IRL2-1 to IRL2-(n−1). According to some example embodiments, the upper optical compensation layer IRL3-U may have a thickness that is 45% to 55% of a thickness of the refractive index layer directly provided under the uppermost refractive index layer. According to some example embodiments, the lower optical compensation layer IRL3-L may have a thickness that is 45% to 55% of a thickness of the refractive index layer directly provided on the lowermost refractive index layer.

The optical compensation layers IRL3-L and IRL3-U, the smaller the deviation in transmittance of the first light, the second light, and the third light passing through the optical control unit. Thus, it may be possible to provide an image with an improved display quality to a user. Hereinafter, the graphs will be described in more detail.

In FIG. 11E, a first graph L-B shows a brightness distribution of a first light generated from a first organic light emitting diode. The first light has a peak within a first central wavelength range. A second graph L-G shows a brightness distribution of a second light generated from a second organic light emitting diode, and a third graph L-R shows a brightness distribution of a third light generated from a third organic light emitting diode. Here, the central wavelength range is a wavelength range, in which a peak of a graph is positioned when the intensity of light generated by an organic light emitting diode is measured according to the wavelength.

The first light may have a wavelength ranging from 410 nm to 480 nm, and the first central wavelength range may range from 440 nm to 460 nm. The second light may have a wavelength ranging from 500 nm to 570 nm, and the second central wavelength range may range from 525 nm to 545 nm. The third light may have a wavelength ranging from 580 nm to 675 nm, and the third central wavelength range may range from 625 nm to 645 nm. In FIG. 11E, peaks of the first, second, and third lights are formed at 451 nm, 534 nm, and 633 nm, respectively.

FIG. 11E shows a change in transmittance versus wavelength characteristics of the optical control unit LCU caused by a change in thickness of the third layer group IRL-G3. A fourth graph GH10 shows transmittance characteristics of the optical control unit LCU including the third layer group IRL-G3, whose thickness is the same as that of the refractive index layer of the second layer group IRL-G2, a fifth graph GH20 shows transmittance characteristics of the optical control unit LCU including the third layer group IRL-G3, whose thickness is 50% of that of the refractive index layer of the second layer group IRL-G2, and a sixth graph GH30 shows transmittance characteristics of the optical control unit LCU including the third layer group IRL-G3, whose thickness is 25% of that of the refractive index layer of the second layer group IRL-G2.

The optical control unit LCU of the fourth graph GH10 is substantially provided in the structure without the third layer group IRL-G3. In other words, the optical control unit LCU is provided to have the uppermost and lowermost second refractive index layers, and first and second refractive index layers alternately stacked between the uppermost and lowermost refractive index layers.

The graphs of FIG. 11E are measured from a nineteen-layered optical control unit LCU including a silicon oxide layer, which is used as the refractive index layer of the first layer group IRL-G1 and has a refractive index of 1.497 and a thickness of 684 Å, and a silicon nitride layer, which is used as the refractive index layer of the second layer group IRL-G2 and has a refractive index of 1.998 and a thickness of 513 Å.

The fourth graph GH10 and the sixth graph GH30 show that the transmittance has a large variation under a change in wavelength of light. When compared with the fourth graph GH10 and the sixth graph GH30, the fifth graph GH20 shows that the amplitude is small. As shown in the fourth graph GH10, the first light has a relatively small transmittance, and as shown in the sixth graph GH30, the second light has a relatively small transmittance. By contrast, the deviations in transmittance of the first to third lights are small, as shown in the fifth graph GH20. The variation in transmittance is smaller in the sixth graph GH30 than in the fourth graph GH10.

Because the refractive index layer of the third layer group IRL-G3 has the afore-described thickness range, compared with the refractive index layer of the second layer group IRL-G2, a deviation of transmittance of lights generated by the first to third organic light emitting diodes may be less than 10% (and in some embodiments, less than 7%).

In each of FIGS. 11F to 11I, a reference graph GH100 corresponds to the eighth graph GH8 of FIG. 11B. The reference graph GH100 shows transmittance versus wavelength characteristics of the optical control unit LCU with an optical structure that is provided in a nineteen-layered structure including the lower optical compensation layer IRL3-L and the upper optical compensation layer IRL3-U.

The graphs of FIGS. 11F to 11I are measured from the optical structure including a silicon oxide layer, which is used as the first refractive index layer and has a refractive index of 1.497 and a thickness of 684 Å, and a silicon nitride layer, which is used as the second refractive index layer and has a refractive index of 1.998 and a thickness of 462 Å. According to experimental and comparative examples, a silicon nitride layer, which has a refractive index of 1.998 and a thickness of 231 Å, is optionally used as the third refractive index layer.

Figure 11F:
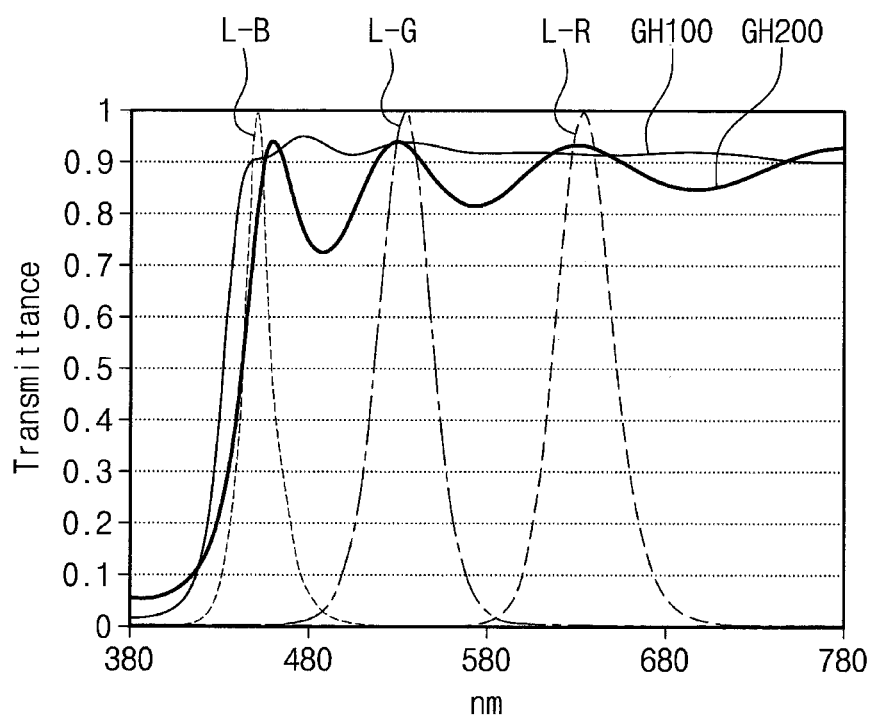
FIGS. 11F to 11I are graphs showing a change in transmittance of light passing through a optical control unit, which is caused when there is a change of a third layer group.

A comparative graph GH200 of FIG. 11F shows transmittance versus wavelength characteristics of the optical control unit LCU, from which the lower optical compensation layer IRL3-L and the upper optical compensation layer IRL3-U are omitted, compared with the optical control unit LCU of the reference graph GH100. Referring to FIG. 11F, most of the comparative graph GH200 is not overlapped with the central wavelength range (e.g., 440 nm-460 nm) of the first graph L-B. Accordingly, the optical control unit according to the comparative example has low transmittance of the first light and a large transmittance variation under a change in wavelength. The comparative example graph GH200 has a large variation in transmittance, as shown in FIG. 11F.

Figure 11G:
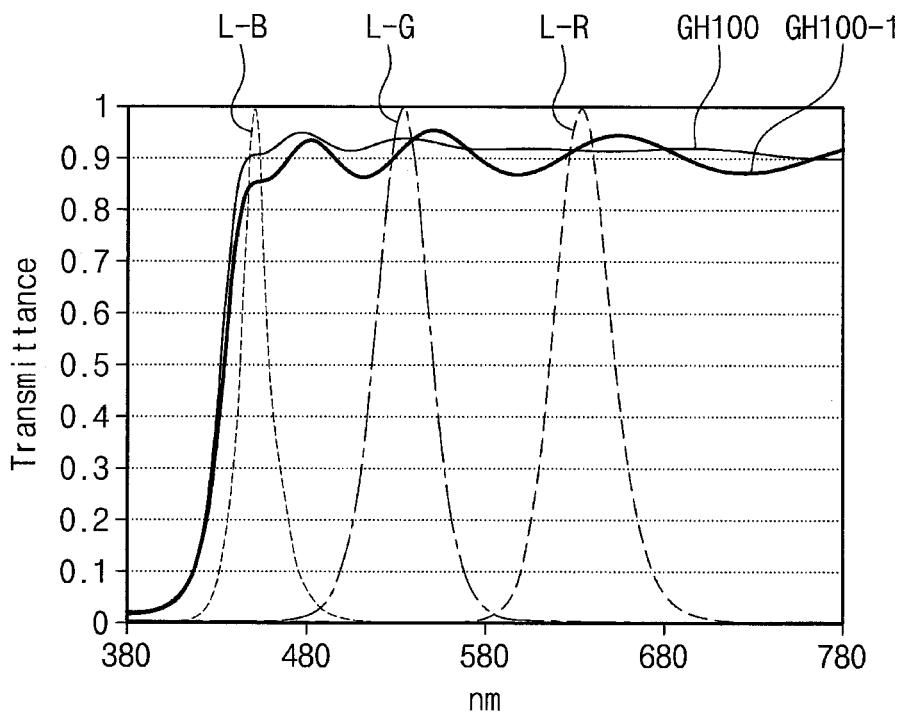
Figure 11H:
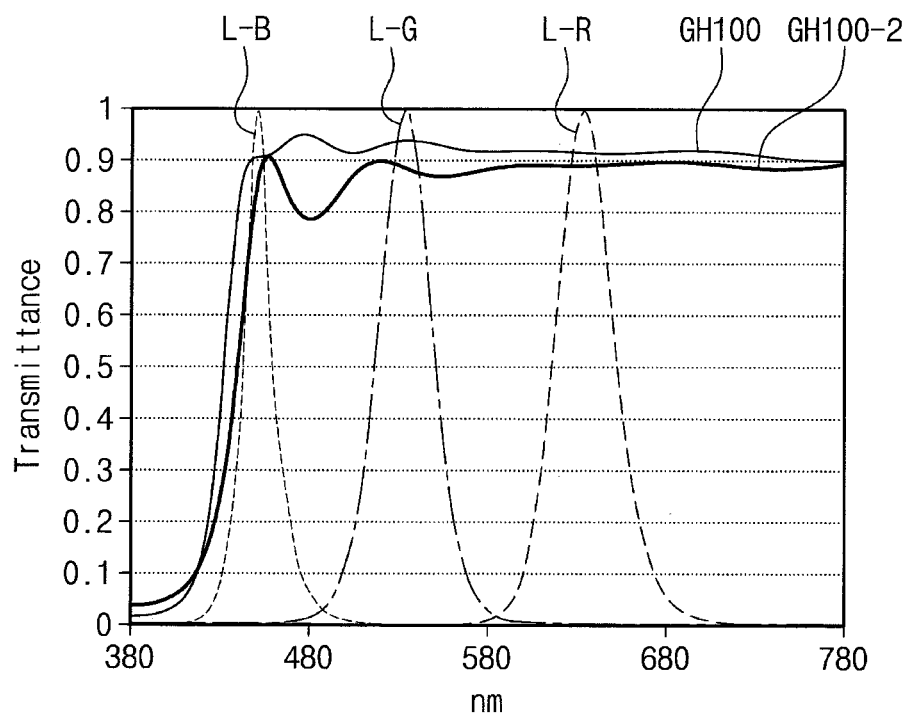

The experimental example graph GH100-1 of FIG. 11G shows transmittance versus wavelength characteristics of the optical control unit LCU, from which the lower optical compensation layer IRL3-L is omitted, compared with the optical control unit LCU for the reference graph GH100, and the experimental example graph GH100-2 of FIG. 11H shows transmittance versus wavelength characteristics of the optical control unit LCU, from which the upper optical compensation layer IRL3-U is omitted, compared with the optical control unit LCU for the reference graph GH100. Referring to the experimental example graphs GH100-1 and GH100-2 of FIGS. 11G and 11H, within the central wavelength ranges of the first to third lights, most of the transmittance is 80% or higher and a deviation of the transmittance is small.

Figure 11I:
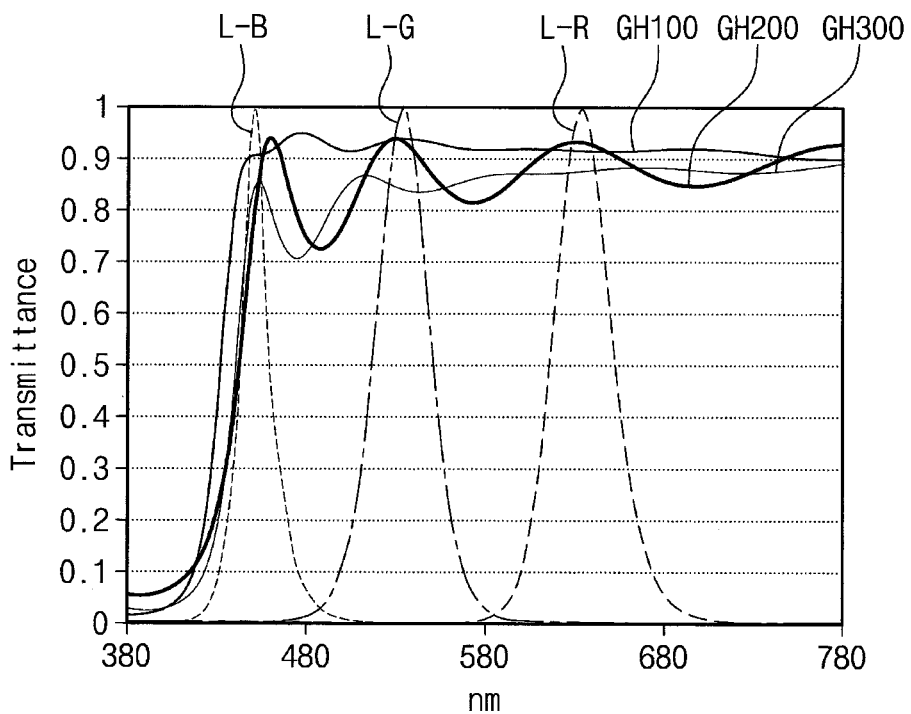

The experimental example graph GH300 of FIG. 11I shows transmittance versus wavelength characteristics of the optical control unit LCU having the eighteen-layered structure. The optical control unit LCU having the eighteen-layered structure may include the lower optical compensation layer IRL3-L, eight first refractive index layers, eight second refractive index layers, which are stacked in an alternating manner with the first refractive index layers, and the upper optical compensation layer IRL3-U.

The optical control unit LCU having the eighteen-layered structure may include a silicon oxide layer, which is used as the first refractive index layer and has a refractive index of 1.497 and a thickness of 684 Å, a silicon nitride layer, which is used as the second refractive index layer and has a refractive index of 1.998 and a thickness of 462 Å, a silicon nitride layer, which is used as the lower optical compensation layer IRL3-L and has a refractive index of 1.998 and a thickness of 231 Å, and a silicon oxide layer, which is used as the upper optical compensation layer IRL3-U and has a refractive index of 1.497 and a thickness of 342 Å.

Within the central wavelength range of the first light, the transmittance in the experimental example graph GH300 is lower than that in the reference graph GH100 but is higher than 80%. The experimental example graph GH300 has a shape resembling the first graph L-B, within the central wavelength range (e.g., 440 nm-460 nm) of the first graph L-B, compared with the comparative example graph GH200.

Figure 12A:
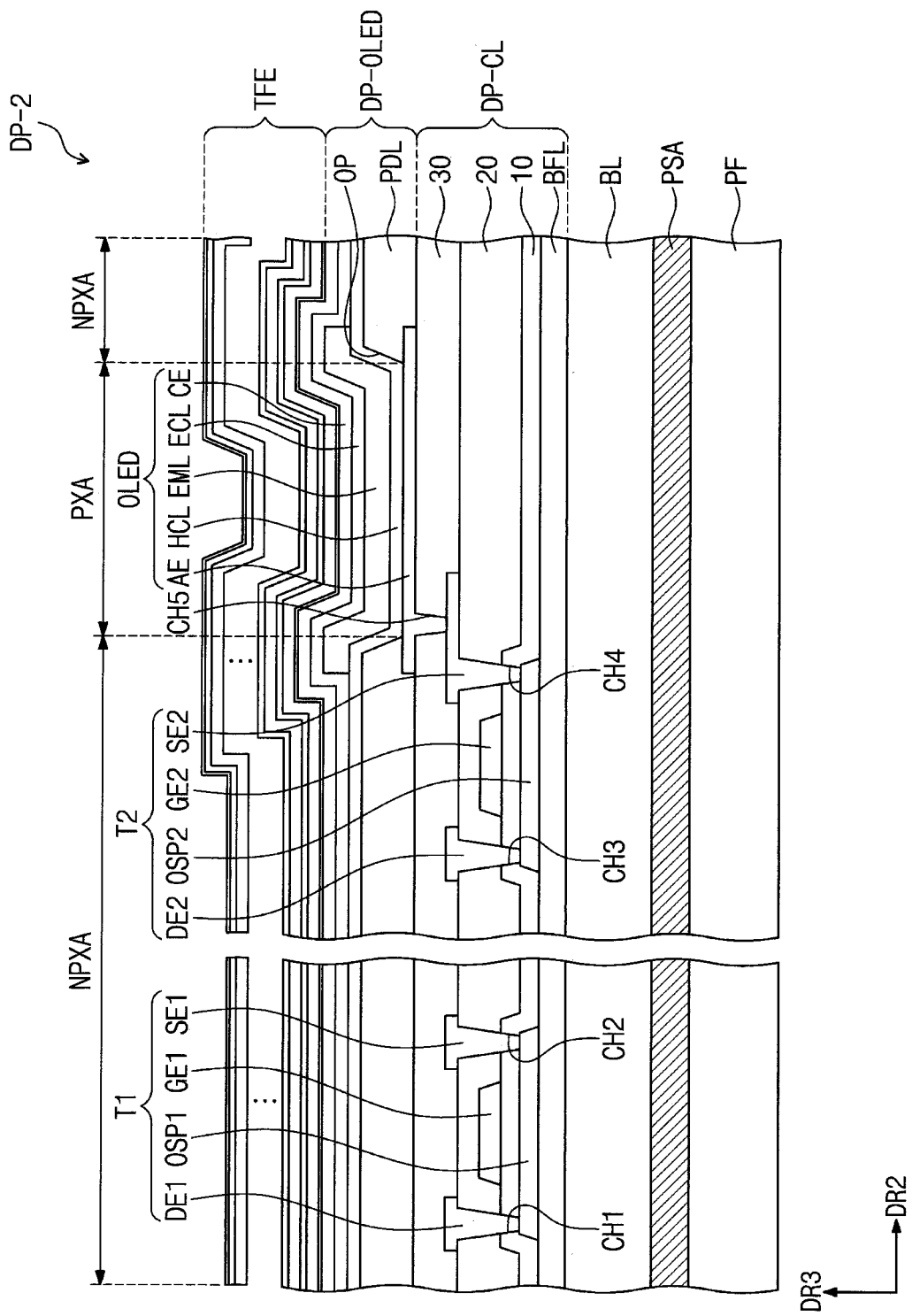
FIG. 12A is a sectional view illustrating a display panel according to some example embodiments.
Figure 12B:
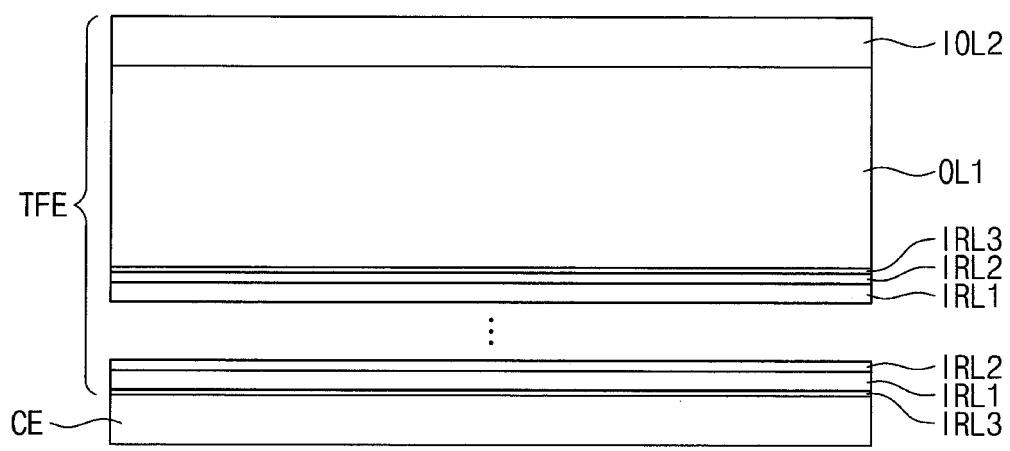
FIG. 12B is a sectional view illustrating a thin-film encapsulation layer according to some example embodiments.
Figure 13A:
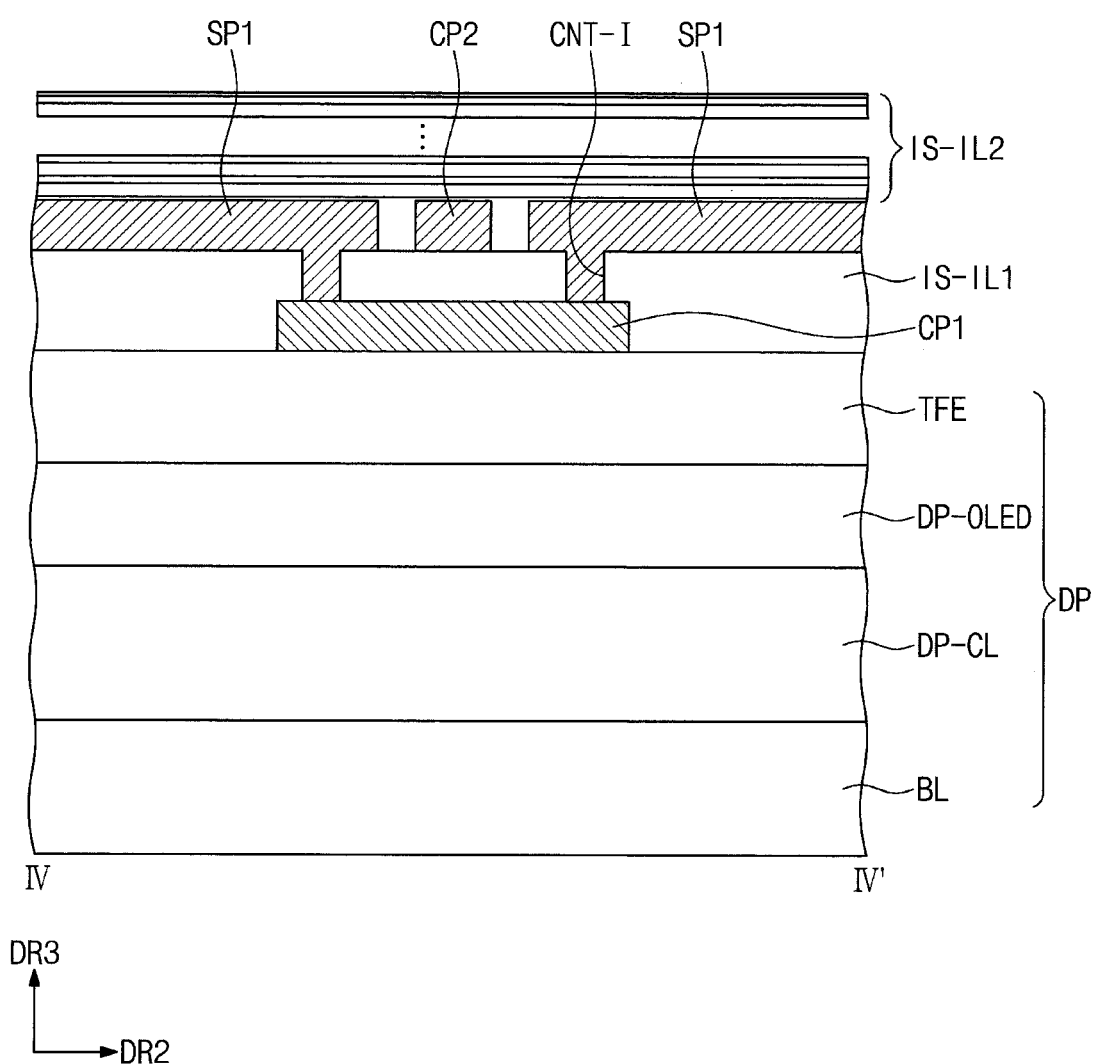
FIG. 13A is a sectional view illustrating an input sensing unit according to some example embodiments.
Figure 13B:
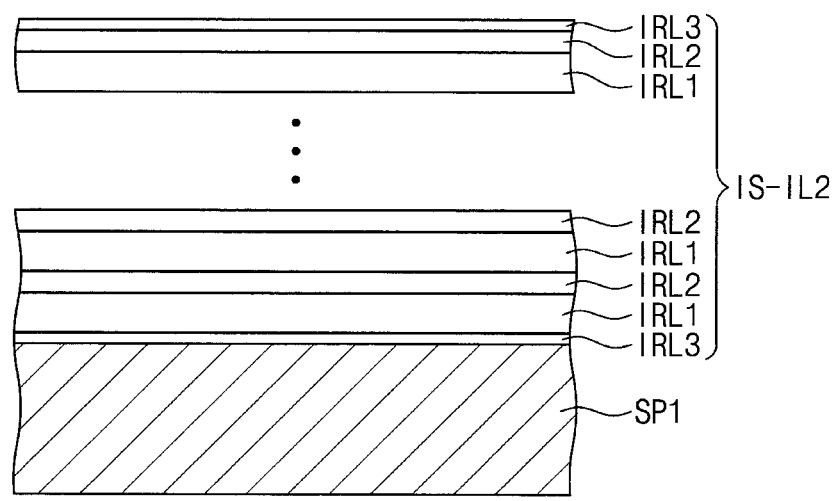
FIG. 13B is an enlarged sectional view illustrating an input sensing unit according to some example embodiments.

FIG. 12A is a sectional view illustrating a display panel DP-2 according to some example embodiments. FIG. 12B is a sectional view illustrating the thin-film encapsulation layer TFE according to some example embodiments. FIG. 13A is a sectional view illustrating an input sensing unit ISU-2 according to some example embodiments. FIG. 13B is an enlarged sectional view illustrating the input sensing unit ISU-2 according to some example embodiments. For concise description, an element previously described with reference to FIGS. 1 to 11I may be identified by the same reference number without repeating an overlapping description thereof.

The display panel DP-2 described with reference to FIG. 3H is illustrated in detail in FIGS. 12A and 12B. The optical control unit LCU described with reference to FIGS. 11A to 11I may constitute the display device DD, regardless of an additional display panel. However, according to some example embodiments, the optical control unit LCU may constitute a portion of the display panel DP-2.

As shown in FIGS. 12A and 12B, the thin-film encapsulation layer TFE may include a plurality of layers. For example, the plurality of layers may include the first layer group IRL-G1, the second layer group IRL-G2, and the third layer group IRL-G3 described with reference to FIGS. 11A to 11I. The first layer group IRL-G1 is shown as the first refractive index layers IRL1, the second layer group IRL-G2 is shown as the second refractive index layers IRL2, and the third layer group IRL-G3 is shown as the third refractive index layers IRL3.

As shown in FIG. 12B, the first refractive index layers IRL1, the second refractive index layers IRL2, and the third refractive index layers IRL3 may be provided below an organic layer OL1. The thin-film encapsulation layer TFE may include at least one inorganic layer 10L2, which is provided on the organic layer OL1.

The input sensing unit ISL-2 described with reference to FIG. 3G is illustrated in detail in FIGS. 13A and 13B. The optical control unit LCU may constitute a portion of the input sensing unit ISL-2.

As shown in FIGS. 13A and 13B, the second insulating layer IS-IL2 may include a plurality of layers. For example, the plurality of layers may include the first layer group IRL-G1, the second layer group IRL-G2, and the third layer group IRL-G3 described with reference to FIGS. 11A to 11I. The first layer group IRL-G1 is shown as the first refractive index layers IRL1, the second layer group IRL-G2 is shown as the second refractive index layers IRL2, and the third layer group IRL-G3 is shown as the third refractive index layers IRL3.

As shown in FIG. 13B, the first refractive index layers IRL1, the second refractive index layers IRL2, and the third refractive index layers IRL3 may be provided on the first insulating layer IS-IL1 to cover the first sensor portions SP1. In some embodiments, the first insulating layer IS-IL1 may include the first layer group IRL-G1, the second layer group IRL-G2, and the third layer group IRL-G3.

According to some example embodiments, it may be possible to prevent a pixel failure from occurring, even when a display device is exposed to a natural light for a long time. This is because the optical control unit is configured to block a short wavelength light causing damage of an organic material of the pixel.

Because the optical control unit includes an optical compensation layer, which is thinner than other refractive index layers, it may be possible to reduce a deviation in transmittance of the first light, the second light, and the third light passing through the optical control unit. Thus, it may be possible to provide an image with an improved display quality to a user.

While aspects of some example embodiments of the inventive concepts have been particularly shown and described, it will be understood by one of ordinary skill in the art that variations in form and detail may be made therein without departing from the spirit and scope of the attached claims, and their equivalents.

What is claimed is:

1. A display device, comprising:
    a base layer;
    a circuit layer on the base layer;
    a display element layer on the circuit layer; and
    an optical control unit on the display element layer,
    wherein the optical control unit comprises first refractive index layers, second refractive index layers, and an optical compensation layer,
    the second refractive index layers are stacked in an alternating manner with the first refractive index layers and have a refractive index different from a refractive index of the first refractive index layers,
    the optical compensation layer comprises a first optical compensation layer located on an uppermost refractive index layer of the first and second refractive index layers and in contact with the uppermost refractive index layer, and a second optical compensation layer located below a lowermost refractive index layer of the first and second refractive index layers and in contact with the lowermost refractive index layer, and
    each of the first optical compensation layer and the second optical compensation layer has a thickness less than a thickness of each of the first and second refractive index layers.

2. The display device of claim 1, wherein each of the first refractive index layers satisfies the following equation 1, and each of the second refractive index layers satisfies the following equation 2, $$2Ta = \left(m + \frac{1}{2}\right) \times \frac{\lambda}{n1} \qquad \text{Equation 1}$$

$$2Tb = \left(m + \frac{1}{2}\right) \times \frac{\lambda}{n2} \qquad \text{Equation 2}$$

where $\lambda$ denotes a wavelength of light and ranges from 390 nm to 420 nm, m is one of 0 and a natural number, Ta is a thickness of each of the first refractive index layers, Tb is a thickness of each of the second refractive index layers, n1 is a refractive index of each of the first refractive index layers at the wavelength $\lambda$, and n2 is a refractive index of each of the second refractive index layers at the wavelength $\lambda$.

3. The display device of claim 2, wherein the refractive index n1 ranges from 1.4 to 1.6, and the refractive index n2 ranges from 1.9 to 2.1.

4. The display device of claim 1, wherein the first refractive index layers comprise at least one of silicon oxynitride, silicon nitride, or silicon oxide, and the second refractive index layers comprise at least one of silicon oxynitride, silicon nitride, or silicon oxide.

5. The display device of claim 4, wherein the first optical compensation layer comprises at least one of silicon oxynitride, silicon nitride, or silicon oxide,
    the second optical compensation layer comprises at least one of silicon oxynitride, silicon nitride, or silicon oxide, and
    the second optical compensation layer comprises a material different from the lowermost refractive index layer.

6. The display device of claim 1, wherein
    the second optical compensation layer comprises a material that is different from the lowermost refractive index layer and is the same as a refractive index layer directly on the lowermost refractive index layer.

7. The display device of claim 6, wherein the first optical compensation layer comprises a material that is different from the uppermost refractive index layer and is the same as a refractive index layer directly below the uppermost refractive index layer.

8. The display device of claim 6, wherein a thickness of the second optical compensation layer is 45% to 55% of a thickness of a refractive index layer directly on the lowermost refractive index layer.

9. The display device of claim 8, wherein a refractive index of the second optical compensation layer is equal to a refractive index of a refractive index layer directly on the lowermost refractive index layer.

10. The display device of claim 1, wherein the display element layer comprises:
   a first organic light emitting diode configured to generate a first light having a peak within a first central wavelength range;
   a second organic light emitting diode configured to generate a second light having a peak within a wavelength range that is longer than the first central wavelength range; and
   a third organic light emitting diode configured to generate a third light having a peak within a wavelength range that is longer than that of the second light.

11. The display device of claim 10, wherein the optical compensation layer is configured to allow light, whose wavelength ranges from 390 nm to 420 nm, to pass therethrough with a transmission ratio of 30% or lower, and
   the first central wavelength range ranges from 440 nm to 460 nm.

12. The display device of claim 10, wherein a deviation in transmittance of the first light, the second light, and the third light passing through the optical compensation layer is less than 7%.

13. The display device of claim 1, wherein the optical control unit is directly on the display element layer.

14. The display device of claim 1, further comprising a thin-film encapsulation layer on the display element layer,
   wherein the optical control unit is on the thin-film encapsulation layer.

15. The display device of claim 1, further comprising a sensing electrode configured to sense an external input, and
   wherein the optical control unit is in contact with the sensing electrode.

16. The display device of claim 1, wherein the first refractive index layers comprise 5 to 15 silicon nitride layers, and
   the second refractive index layers comprise 5 to 15 silicon oxide layers.

17. The display device of claim 1, wherein the first refractive index layers comprise one of silicon nitride and silicon oxide, and the second refractive index layers comprise the other one of silicon nitride and silicon oxide.

18. A display device, comprising:
   a base layer;
   first to third driving transistors on the base layer;
   first to third light-emitting diodes, which are respectively connected to the first to third transistors and are used to generate first to third lights, respectively, whose wavelengths are different from each other; and
   a light control unit on the first to third light-emitting diodes,
   wherein the light control unit comprises first refractive index layers, second refractive index layers, and an optical compensation layer,
   the second refractive index layers are stacked in an alternating manner with the first refractive index layers and have a refractive index different from that of the first refractive index layers,
   the optical compensation layer comprises a first optical compensation layer located on the uppermost refractive index layer of the first and second refractive index layers and in contact with the uppermost refractive index layer and a second optical compensation layer located below the lowermost refractive index layer of the first and second refractive index layers and in contact with the lowermost refractive index layer,
   each of the first optical compensation layer and the second optical compensation layer has a thickness less than a thickness of each of the first and second refractive index layers, and
   the light control unit is configured to allow light that has a wavelength in a range from 390 nm to 420 nm, to pass therethrough with a transmission ratio of 30% or lower, and to allow the first to third lights to pass therethrough with a transmission ratio of 80% or higher.

19. The display device of claim 18, wherein a peak of the first light is positioned at a wavelength that is longer than a wavelength of 390 nm to 420 nm,
   the second light has a wavelength longer than that of the first light, and
   the third light has a wavelength longer than that of the second light.

20. The display device of claim 18, wherein a deviation in transmittance of the first to third lights passing through the optical compensation layer is less than 7%.

* * * * *